US008901567B2

(12) United States Patent
Saito

(10) Patent No.: US 8,901,567 B2
(45) Date of Patent: Dec. 2, 2014

(54) SEMICONDUCTOR DEVICE AND MANUFACTURING METHOD THEREOF

(71) Applicant: Semiconductor Energy Laboratory Co., Ltd., Atsugi (JP)

(72) Inventor: Toshihiko Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/174,494

(22) Filed: Feb. 6, 2014

(65) Prior Publication Data
US 2014/0151675 A1 Jun. 5, 2014

Related U.S. Application Data

(60) Continuation of application No. 12/984,139, filed on Jan. 4, 2011, now Pat. No. 8,647,942, which is a division of application No. 11/438,066, filed on May 22, 2006, now Pat. No. 7,868,320.

(30) Foreign Application Priority Data

May 31, 2005 (JP) ................. 2005-160343

(51) Int. Cl.
H01L 29/04 (2006.01)
H01L 27/28 (2006.01)
G11C 5/02 (2006.01)
G11C 8/08 (2006.01)
H01L 27/105 (2006.01)
H01L 27/12 (2006.01)
H01L 49/02 (2006.01)

(52) U.S. Cl.
CPC ............... H01L 27/28 (2013.01); G11C 5/025 (2013.01); G11C 8/08 (2013.01); H01L 27/105 (2013.01); H01L 27/12 (2013.01); H01L 28/40 (2013.01); H01L 27/1052 (2013.01); H01L 27/1214 (2013.01)
USPC ........................................... 257/72

(58) Field of Classification Search
CPC ..................................... H01L 27/1225
USPC ....................................... 257/59, 72
See application file for complete search history.

(56) References Cited

U.S. PATENT DOCUMENTS 3,833,894 A  9/1974 Aviram et al.
4,860,254 A  8/1989 Pott et al.
(Continued)

FOREIGN PATENT DOCUMENTS

EP  0 474 474 A  3/1992
EP  1 341 186  9/2003
(Continued)

OTHER PUBLICATIONS

Lemos, "RFID Tags Become Easy Target for Hacker," http://japan.cnet.com/news/sec/story/0,2000056024,20070122,00.htm, Jul. 29, 2004, pp. 1-2.
(Continued)

Primary Examiner — Bradley K Smith
(74) Attorney, Agent, or Firm — Eric J. Robinson; Robinson Intellectual Proprty Law Office, P.C.

(57) ABSTRACT

An object of the invention is to reduce an area occupied by a capacitor in a circuit in a semiconductor device, and to downsize a semiconductor device on which the capacitor and an organic memory are mounted. The organic memory and the capacitor, included in a peripheral circuit, in which the same material as the layer containing the organic compound used for the organic memory is used as a dielectric, are used. The peripheral circuit here means a circuit having at least a capacitor such as a resonance circuit, a power supply circuit, a boosting circuit, a DA converter, or a protective circuit. Further, a capacitor in which a semiconductor is used as a dielectric may be provided over the same substrate as well as the capacitor in which the same material as the layer containing the organic compound is used as a dielectric. In this case, it is desirable that the capacitor in which the same material as the layer containing the organic compound is used as a dielectric and the capacitor in which the semiconductor is used as a dielectric are connected to each other in parallel.

11 Claims, 27 Drawing Sheets

(56) References Cited

U.S. PATENT DOCUMENTS

| | | |
|---|---|---|
| 5,349,366 A | 9/1994 | Yamazaki et al. |
| 5,375,250 A | 12/1994 | Van den Heuvel |
| 5,497,140 A | 3/1996 | Tuttle |
| 5,637,187 A | 6/1997 | Takasu et al. |
| 5,883,397 A | 3/1999 | Isoda et al. |
| 6,013,949 A | 1/2000 | Tuttle |
| 6,045,652 A | 4/2000 | Tuttle |
| 6,055,180 A | 4/2000 | Gudesen et al. |
| 6,133,835 A | 10/2000 | De Leeuw et al. |
| 6,229,443 B1 | 5/2001 | Roesner |
| 6,281,552 B1 | 8/2001 | Kawasaki et al. |
| 6,321,067 B1 | 11/2001 | Suga et al. |
| 6,331,722 B1 | 12/2001 | Yamazaki et al. |
| 6,340,588 B1 | 1/2002 | Nova et al. |
| 6,427,065 B1 | 7/2002 | Suga et al. |
| 6,525,595 B2 | 2/2003 | Oku |
| 6,528,815 B1 | 3/2003 | Brown et al. |
| 6,683,322 B2 | 1/2004 | Jackson et al. |
| 6,683,802 B2 | 1/2004 | Katoh |
| 6,693,541 B2 | 2/2004 | Egbert |
| 6,741,178 B1 | 5/2004 | Tuttle |
| 6,809,952 B2 | 10/2004 | Masui |
| 6,847,047 B2 | 1/2005 | Vanbuskirk et al. |
| 6,856,630 B2 | 2/2005 | Tanaka |
| 6,872,969 B2 | 3/2005 | Redecker |
| 6,878,980 B2 | 4/2005 | Gudesen et al. |
| 6,894,351 B2 | 5/2005 | Okawa et al. |
| 6,903,958 B2 | 6/2005 | Bernds et al. |
| 6,950,331 B2 | 9/2005 | Yang et al. |
| 6,977,389 B2 | 12/2005 | Tripsas et al. |
| 7,034,355 B2 | 4/2006 | Miki |
| 7,050,326 B2 | 5/2006 | Anthony |
| 7,093,765 B2 | 8/2006 | Baldischweiler et al. |
| 7,139,548 B2 | 11/2006 | Hayashi et al. |
| 7,158,031 B2 | 1/2007 | Tuttle |
| 7,158,401 B2 | 1/2007 | Bhattacharyya |
| 7,359,230 B2 | 4/2008 | Sumida et al. |
| 7,408,218 B2 | 8/2008 | Akiyama et al. |
| 7,499,305 B2 | 3/2009 | Nomura et al. |
| 7,683,419 B2 | 3/2010 | Akiyama et al. |
| 7,688,624 B2 | 3/2010 | Abe et al. |
| 7,781,758 B2 | 8/2010 | Abe et al. |
| 7,804,118 B2 | 9/2010 | Akiyama et al. |
| 2002/0056838 A1* | 5/2002 | Ogawa ............................ 257/59 |
| 2003/0197179 A1* | 10/2003 | Yamazaki et al. ............... 257/59 |
| 2004/0164302 A1 | 8/2004 | Arai et al. |
| 2005/0017302 A1 | 1/2005 | Hoffman |
| 2005/0099839 A1 | 5/2005 | Bhattacharyya |
| 2005/0174875 A1 | 8/2005 | Katoh |
| 2006/0267068 A1 | 11/2006 | Sato et al. |
| 2007/0194301 A1 | 8/2007 | Sezi et al. |
| 2010/0314676 A1 | 12/2010 | Akiyama et al. |

FOREIGN PATENT DOCUMENTS

| | | |
|---|---|---|
| EP | 1 453 088 | 9/2004 |
| JP | 04-362924 A | 12/1992 |
| JP | 07-022669 | 1/1995 |
| JP | 2775040 | 7/1998 |
| JP | 2000-299440 | 10/2000 |
| JP | 2001-338733 A | 12/2001 |
| JP | 2001-345431 | 12/2001 |
| JP | 2004-509458 | 3/2004 |
| JP | 2005-510078 | 4/2005 |
| WO | WO 02/37500 | 5/2002 |
| WO | WO 03/044801 | 5/2003 |
| WO | WO 03/052829 | 6/2003 |
| WO | WO 2004/015778 | 2/2004 |
| WO | WO 2005/096380 | 10/2005 |
| WO | WO 2006/043611 | 4/2006 |
| WO | WO 2006/043687 | 4/2006 |

OTHER PUBLICATIONS

Chinese Office Action (Application No. 201110056961.0) dated Apr. 28, 2012.

Chinese Office Action (Application No. 201110056961.0) dated Jul. 3, 2013.

* cited by examiner

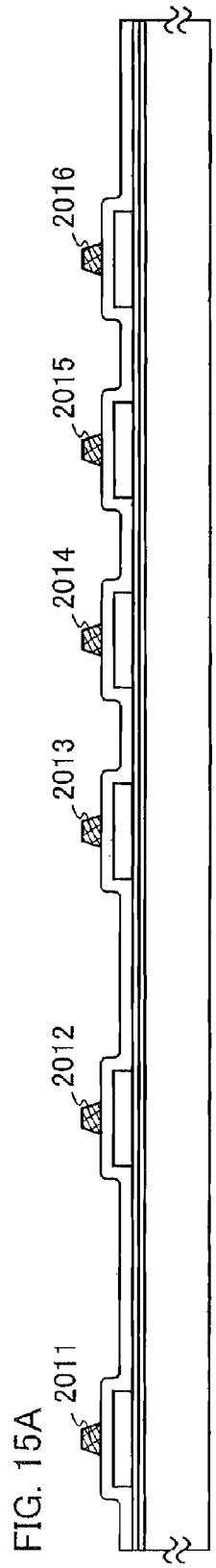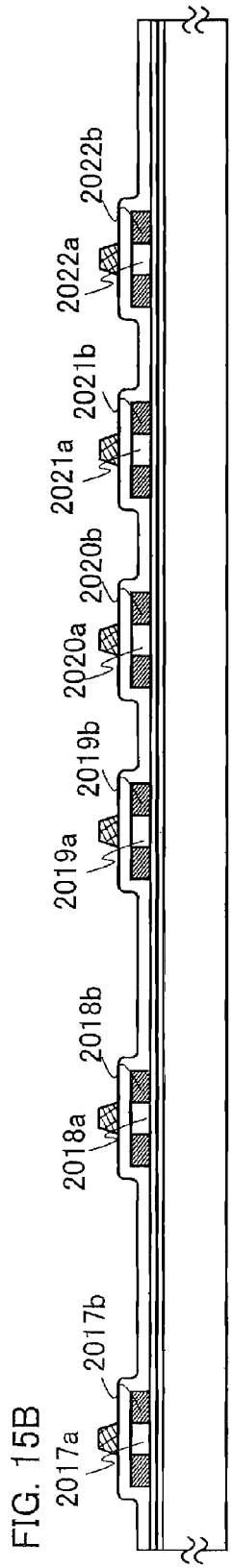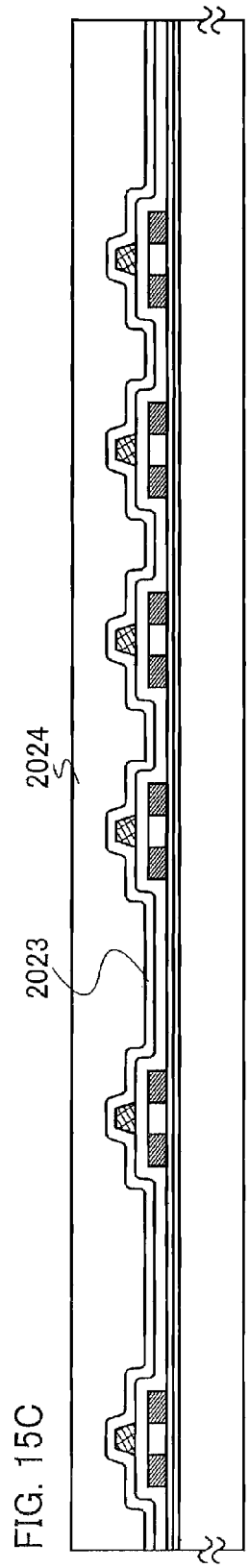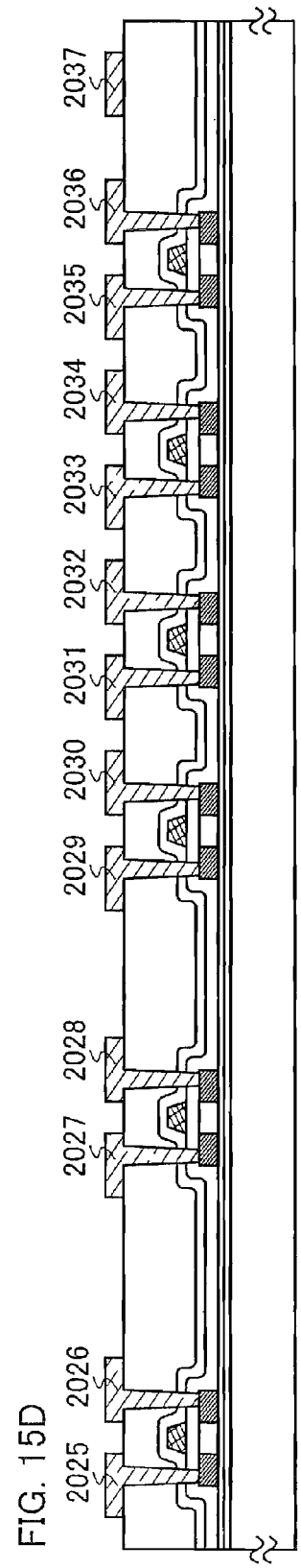

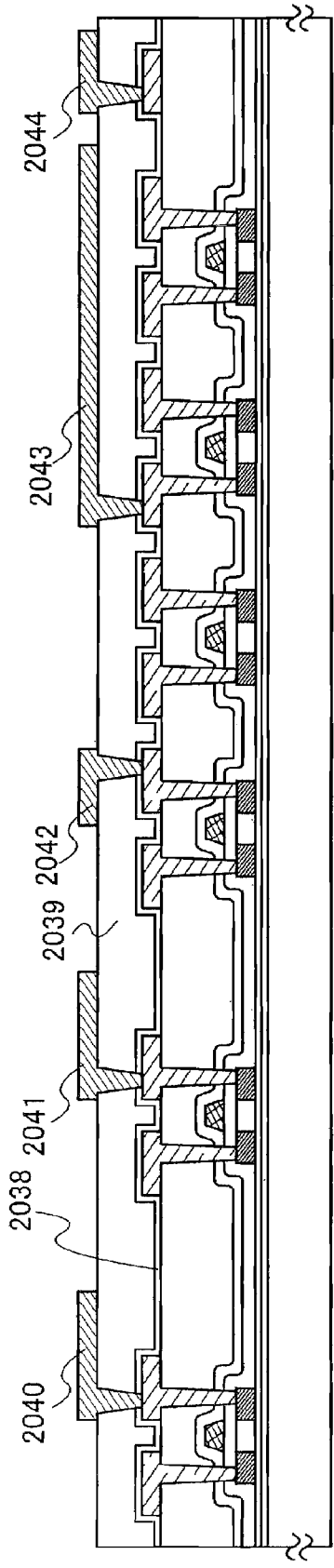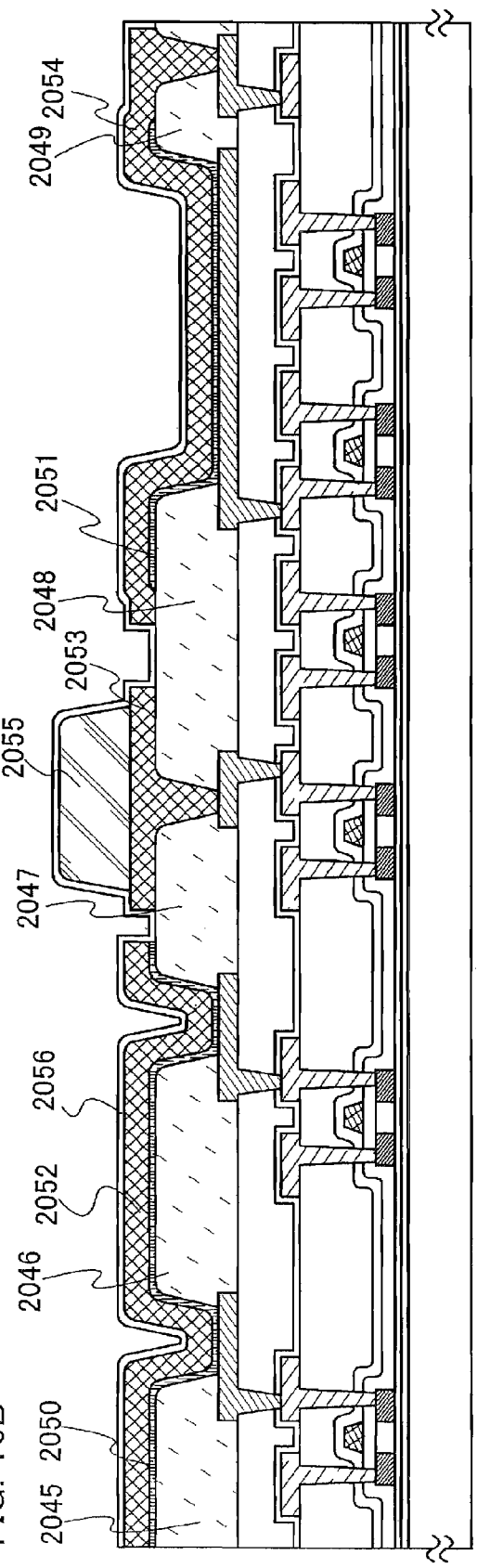

SEMICONDUCTOR DEVICE AND MANUFACTURING METHOD THEREOF

BACKGROUND OF THE INVENTION

1. Field of the Invention

The present invention relates to a semiconductor device and a manufacturing method of the semiconductor device. Particularly, the invention relates to a semiconductor device which can store data by using an organic compound in a memory circuit and a capacitor.

2. Description of the Related Art

In recent years, identification technology where an ID (identification number) is assigned to each object so as to reveal data thereon such as the history has been attracting attention, which is utilized for production management and the like. Above all, semiconductor devices capable of communicating data wirelessly have been developed. Such semiconductor devices include an RFID (Radio Frequency Identification) tag (also called an ID tag, an IC tag, an IC chip, an RF (Radio Frequency) tag, a wireless tag, an electronic tag, or a wireless chip) and the like have been introduced into companies, the market and the like.

Many of these semiconductor devices have a circuit using a semiconductor substrate such as silicon (Si) (hereinafter referred to as an IC (Integrated Circuit) chip) and an antenna. The IC chip includes a memory circuit (hereinafter referred to as a memory), a control circuit, and the like. Further, semiconductor devices having a control circuit, a memory circuit and the like which have an organic thin film transistor (hereinafter also referred to as a TFT), an organic memory, and the like, using an organic compound have been actively developed.

For example, an example using an organic memory is Patent Document 1 (Japanese Patent Laid-Open No. Hei 7-22669). In addition, for example, an example of an RFID is Patent Document 2 (Japanese Patent Laid-Open No. 2000-299440).

SUMMARY OF THE INVENTION

However, as a capacitor which is used in a circuit forming the aforementioned semiconductor device, there are many cases in which a source electrode and a drain electrode of a transistor formed over a substrate are connected, and capacity generated between a semiconductor layer and a gate electrode is used. In this case, there is advantageous in that it can be formed with another transistor at the same time; however, on the other hand, there is a problem in that the proportion of a capacity area to a semiconductor device area is large, and reduction thereof is difficult.

Further, in a case where capacity is increased for improvement of a rectifying ability and a booster function, the increase of capacity is directly linked to the increase of the semiconductor device area in the capacity using a semiconductor layer and a gate electrode. However, particularly, a semiconductor device which is used for an RFID is preferably downsized as much as possible, and the reduction of a capacitor occupied in the semiconductor device or the increase of capacity is desired.

The invention is made in view of that point, and an object is to reduce a capacitor area occupied in a circuit of a semiconductor device to downsize the semiconductor device having the capacitor and an organic memory, or to increase capacity in the circuit without increasing an area of the semiconductor device for improvement of function. Note that a semiconductor device in this specification means a device which can function by using semiconducting properties. By using the invention, a semiconductor device such as an integrated circuit having a multilayer wiring layer or a processor chip (also called a wireless chip, a wireless processor, a wireless memory, or a wireless tag) can be formed.

According to one of the invention, a memory portion and a peripheral circuit connected electrically to the memory portion are provided over the same substrate. The memory portion has a bit line extended in a first direction, a word line extended in a second direction perpendicular to the first direction, and a memory element formed with a stacked-layer structure of a first conductive layer forming the bit line, a layer containing an organic compound, and a second conductive layer forming the word line. The peripheral circuit has a capacitor having a dielectric layer formed by the same material as the layer containing the organic compound.

According to one of the invention, a memory portion, a circuit for controlling the memory portion, and a power supply circuit are provided over the same substrate. The memory portion has a bit line extended in a first direction, a word line extended in a second direction perpendicular to the first direction, and a memory element formed with a stacked-layer structure of a first conductive layer forming the bit line, a layer containing an organic compound, and a second conductive layer forming the word line. The power supply circuit has a capacitor having a dielectric layer formed by the same material as the layer containing the organic compound.

According to one of the invention, a memory portion, a circuit for controlling the memory portion, and a transmitter/receiver circuit are provided over the same substrate. The memory portion has a bit line extended in a first direction, a word line extended in a second direction perpendicular to the first direction, and a memory element formed with a stacked-layer structure of a first conductive layer forming the bit line, a layer containing an organic compound, and a second conductive layer forming the word line. The transmitter/receiver circuit has a capacitor having a dielectric layer formed by the same material as the layer containing the organic compound.

According to one of the invention, a memory portion and a peripheral circuit connected electrically to the memory portion are provided over the same substrate. The memory portion has a memory cell array formed of a plurality of memory cells, each of them having a transistor and a memory element. The memory element has a first conductive layer connected electrically to a source or drain region of the transistor, an organic compound layer provided over the first conductive layer, and a second conductive layer provided over the organic compound layer. The peripheral circuit has a capacitor having a dielectric layer formed by the same material as the layer containing the organic compound.

According to one of the invention, a memory portion, a circuit for controlling the memory portion, and a power supply circuit are provided over the same substrate. The memory portion has a memory cell having a memory cell array formed of a plurality of the memory cells, each of them having a transistor and a memory element. The memory element has a first conductive layer connected electrically to a source or drain region of the transistor, an organic compound layer provided over the first conductive layer, and a second conductive layer provided over the organic compound layer. The power supply circuit has a capacitor having a dielectric layer formed by the same material as the layer containing the organic compound.

According to one of the invention, a memory portion, a circuit for controlling the memory portion, and a transmitter/receiver circuit are provided over the same substrate. The memory portion has a memory cell array formed of a plurality of memory cells, each of them having a transistor and a memory element. The memory element has a first conductive layer connected electrically to a source or drain region of the transistor, an organic compound layer provided over the first conductive layer, and a second conductive layer provided over the organic compound layer. The transmitter/receiver circuit has a capacitor having a dielectric layer formed by the same material as the layer containing the organic compound.

The aforementioned configurations may have a first capacitor having a dielectric layer formed by the same material as the layer containing the organic compound and a second capacitor having a dielectric layer formed by a semiconductor layer over the same substrate. Note that it is desirable that the first capacitor having a dielectric layer formed by the same material as the layer containing the organic compound and the second capacitor having a dielectric layer formed by the semiconductor are connected to each other in parallel. Further, the same material as the second conductive layer may be used for one electrode of the first capacitor having a dielectric layer formed by the same material as the layer containing the organic compound.

Note that in the aforementioned configurations, an element having a rectifying property may be provided between the first conductive layer and the layer containing the organic compound or between the layer containing the organic compound and the second conductive layer. For the element having the rectifying property, a transistor having a gate electrode connected to a drain electrode is used.

One of the invention is a manufacturing method of a semiconductor device having a memory portion having a memory element, and a peripheral circuit connected electrically to the memory portion, and the peripheral circuit having a capacitor, over an insulating surface, in which a first conductive layer, a layer containing an organic compound, and a second conductive layer are formed sequentially from a bottom, over the insulating surface. The layer containing the organic compound is used for a dielectric layer of the capacitor.

One of the invention is a manufacturing method of a semiconductor device having a memory portion having a transistor, a peripheral circuit connected electrically to the memory portion, the peripheral circuit having a first capacitor and second capacitor, over a substrate having an insulating surface, in which a first semiconductor layer and a second semiconductor layer are formed over the substrate having the insulating surface; a transistor having the first semiconductor layer and the first capacitor having the second semiconductor layer are formed; a first conductive layer connected electrically to the transistor, and a layer containing an organic compound are formed over the first conductive layer; a second conductive layer is formed over the layer containing the organic compound overlapping with the first conductive layer. The layer containing the organic compound is used as a dielectric layer of the second capacitor.

In the aforementioned configurations, the first capacitor and the second capacitor are preferably connected to each other in parallel. Further, the same material as the second conductive layer may be used for one electrode of the capacitor.

Note that in the aforementioned configuration, an element having a rectifying property may be provided between the first conductive layer and the layer containing the organic compound or between the layer containing the organic compound and the second conductive layer. A transistor having a gate electrode connected to a drain electrode is used as the element having the rectifying property.

Note that an organic memory means a memory with a layer containing an organic compound interposed between a pair of conductive layers. In the invention, a capacitor having a dielectric layer formed by the same material as the layer containing the organic compound used for the organic memory is used. The peripheral circuit in this specification means a circuit having at least a capacitor, such as a resonance circuit, a power supply circuit, a boosting circuit, a DA converter, or a protective circuit. Further, a capacitor having a dielectric layer formed by a semiconductor may be provided in addition to the capacitor having a dielectric layer formed by the same material as the layer containing the organic compound, over the same substrate. In this case, it is desirable that the capacitor having a dielectric layer formed by the same material as the layer containing the organic compound and the capacitor having a dielectric layer formed by the semiconductor are connected to each other in parallel.

By the invention, a semiconductor device over which an organic memory capable of forming easily and inexpensively is mounted can be obtained without using a special process and without increasing a process particularly.

In a conventional capacitor having the same semiconductor layer as a transistor, as a dielectric layer, the effective capacity is obtained only in an area overlapping with a gate insulating film and a semiconductor layer. In contrast, in a capacitor which has a layer containing an organic compound used for an organic memory, since the capacitor can be arranged over an element such as a transistor or a wiring, most of an area required for the arrangement can contribute to capacity; thereby a capacitor area occupied in a circuit in a semiconductor device can be reduced.

Further, when a material having high dielectric constant is selectively used for the layer containing the organic compound related to the invention, a capacitance value per unit area of a capacitor can be improved.

BRIEF DESCRIPTION OF THE DRAWINGS

FIGS. 15A to 15D are cross-sectional views each showing a step for forming a circuit of the invention.

FIGS. 16A and 16B are cross-sectional views each showing a step for forming a circuit of the invention.

DETAILED DESCRIPTION OF THE INVENTION

Figure 1:
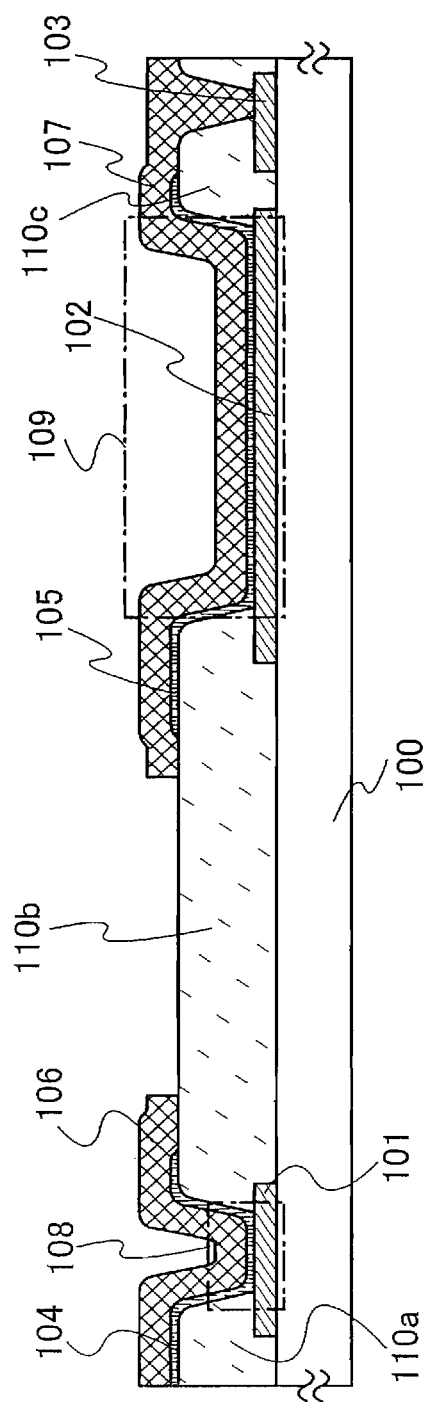
FIG. 1 is a cross-sectional view showing an embodiment mode of the invention.

[Best Mode for Carrying Out the Invention]

Although the present invention will be fully described by way of embodiment modes with reference to the accompanying drawings; however, it is to be understood that various changes and modifications will be apparent to those skilled in the art. Therefore, unless such changes and modification depart from the scope of the present invention, they should be construed as being included therein. Note that in all the drawings for illustrating the invention, the identical portions or portions having the identical function are denoted by the identical reference numerals, and description thereof is omitted.

(Embodiment Mode 1)

In this embodiment mode, one structural example of a semiconductor device formed of a memory element in which a layer containing an organic compound is provided between two conductive layers and a capacitor in which a layer containing the same organic compound as the memory element between two conductive layers is described with reference to drawings.

As for the semiconductor device related to the invention, a memory element 108 and a capacitor 109 are formed over a substrate 100 as shown in FIG. 1.

The memory element 108 shown in FIG. 1 is formed by stacking a first conductive layer 101, a layer containing an organic compound 104 and a second conductive layer 106. Further, the capacitor 109 is formed by stacking a first conductive layer 102, a layer containing an organic compound 105 using the same material as the memory element portion, and a second conductive layer 107. Partition layers 110a, 110b, and 110c have a function to prevent the first conductive layer 101 and the second conductive layer 106, or the first conductive layer 102 and the second conductive layer 107 from being contacted directly.

The first conductive layers 101, 102, and 103, the layers containing the organic compound 104 and 105, the second conductive layers 106 and 107, and the partition layers 110a, 110b, and 110c can be formed in the same processes respectively. Therefore, corresponding layers of the memory element 108 and the capacitor 109 can be formed in the same process at the same time.

In the structure, an element, a compound, or the like having high conductivity is used for the first conductive layers 101, 102, and 103 and the second conductive layers 106 and 107. Typically, a single layer or a stacked layer structure formed from selected from among gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta) or the like or an alloy including a plurality of the elements can be used. As the alloy including a plurality of the elements, for example, an alloy Al including Al and Ti, an alloy including Ti, and C, an alloy including Al and Ni, an alloy including Al and C, an alloy including Al, Ni, and C, an alloy including Al and Mo, or the like can be used. The aforementioned material can be formed by vapor deposition, sputtering, CVD, printing, or a droplet-discharging method. For example, Ag is fowled by a droplet-discharging method, or Al can be formed by vapor deposition.

Further, one or both of the first conductive layers 101, 102, and 103; and the second conductive layers 106 and 107 may be provided so as to have a light transmitting property. The conductive layer having a light transmitting property is formed of a transparent conductive material or formed to have a film thickness which transmits light without using a transparent conductive material. As the transparent conductive material, a conductive oxide material having a light transmitting property such as indium tin oxide (ITO), zinc oxide (ZnO), indium zinc oxide (IZO), or zinc oxide added with gallium (GZO) can be used. In addition, indium tin oxide containing ITO and silicon oxide (hereinafter referred to as ITSO) or indium oxide containing silicon oxide and zinc oxide (ZnO) of 2 to 20 wt % may be used.

The layers containing the organic compound 104 and 105 are formed of an organic compound, an organic compound in which conductivity is changed by an electric action, or a layer in which an organic compound and an inorganic compound are mixed. The layers containing the organic compound 104 and 105 may be formed with a single layer or with a plurality of layers stacked. Moreover, a layer formed of an organic compound in which conductivity is changed by an electric action may be stacked as well.

An organic resin represented by polyimide, acrylic, polyamide, benzocyclobutene, epoxy, or the like is used for the organic compound which can form the layers containing the organic compound 104 and 105.

Further, an organic compound material having a hole transporting property, an organic compound material having an electron transporting property, or the like is used for the organic compound in which conductivity is changed by the electric action, which can form the layers containing the organic compound 104 and 105.

As the organic compound material having a hole transporting property, an aromatic amine-based compound (namely including a benzene ring-nitrogen bond) such as 4,4'-bis[N-(1-naphthyl)-N-phenylamino]biphenyl (abbreviated: α-NPD), 4,4'-bis[N-(3-methylphenyl)-N-phenylamino]biphenyl (abbreviated: TPD) 4,4',4''-tris(N,N-diphenylamino)triphenylamine (abbreviated: TDATA), 4,4',4''-tris[N-(3-methylphenyl)-N-phenylamino]triphenylamine (abbreviated: MTDATA), or 4,4'-bis(N-(4-(N,N-di-m-tolylamino)phenyl)-N-phenylamino)biphenyl (abbreviated: DNTPD) or a phthalocyanine compound such as phthalocyanine (abbreviated: $H_2Pc$), copper phthalocyanine (abbreviated: CuPc), or vanadyl phthalocyanine (abbreviated: VOPc) can be used. The substances described here are substances mainly having a hole mobility of $10^{-6}$ $cm^2/Vs$ or more.

For the organic compound material having an electron transporting property, a material formed of a metal complex having a quinoline skeleton or a benzoquinoline skeleton such as tris(8-quinolinolato)aluminum (abbreviated: Alq$_3$), tris(4-methyl-8-quinolinolato)aluminum (abbreviated: Almq$_3$), bis(10-hydroxybenzo[h]-quinolinato)beryllium (abbreviated: BeBq$_2$), or bis(2-methyl-8-quinolinolato)(4-phenylphenolato)aluminum (abbreviated: BAlq), or the like can be used. Further, a material of a metal complex having an oxazole or thiazole ligand such as bis[2-(2-hydroxyphenyl)benzoxazolato]zinc (abbreviated: Zn(BOX)$_2$) or bis[2-(2-hydroxyphenyl)benzothiazolato]zinc (abbreviated: Zn(BTZ)$_2$), or the like can be used.

Moreover, other than metal complex, the 2-(4-biphenylyl)-5-(4-tert-butylphenyl)-1,3,4-oxadiazole (abbreviated: PBD); 1,3-bis[5-(p-tert-butylphenyl)-1,3,4-oxadiazol-2-yl]benzene (abbreviated: OXD-7); 3-(4-tert-butylphenyl)-4-phenyl-5-(4-biphenylyl)-1,2,4-triazole (abbreviated: TAZ); 3-(4-tert-butylphenyl)-4-(4-ethylphenyl)-5-(4-biphenylyl)-1,2,4-triazole (abbreviated: p-EtTAZ); bathophenanthroline (abbreviated: BPhen); bathocuproin (abbreviated: BCP); or the like can be used. The substances described here are substances mainly having an electron mobility of $10^{-6}$ cm$^2$/Vs or more.

For the manufacturing method, vapor deposition, an electron beam evaporation method, sputtering, CVD, or the like can be used for forming. Further, the mixed layer containing an organic compound and an inorganic compound can be formed by depositing each material at the same time; the mixed layer can be formed by combining the same or different methods, such as coevaporation by resistance heating evaporation, coevaporation by electron beam evaporation, coevaporation by resistance heating evaporation and electron beam evaporation, deposition by resistance heating evaporation and sputtering, or deposition by electron beam evaporation and sputtering. Further, coating, a droplet-discharging method, printing (a method for forming a pattern selectively such as screen printing or offset printing), or the like can be used.

Moreover, the capacitance value per unit area of the capacitor 109 can be improved by using the material having high dielectric constant to the layers containing the organic compound 104 and 105.

As the partition layers 110a, 110b, and 110c, an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular such as polyimide, aromatic polyimide, or polybenzimidazole; or a siloxane resin may be used. Note that the siloxane resin corresponds to a resin including a Si—O—Si bond. Siloxane is composed of a skeleton formed by the bond of silicon (Si) and oxygen (O). As a substituent, an organic group including at least hydrogen (for example, an alkyl group or an aromatic hydrocarbon) is used. Alternatively, a fluoro group may be used as the substituent. Further, an organic group containing at least hydrogen and a fluoro group may be used as the substituent. In addition, a resin material such as a vinyl resin such as polyvinyl alcohol or polyvinyl butyral, an epoxy resin, a phenol resin, a novolac resin, an acrylic resin, a melamine resin, or a urethane resin is used. Further, an organic material such as benzocyclobutene, parylene, aryl fluoride ether, or polyimide; a composition material including a water-soluble homopolymer and a water-soluble copolymer; or the like may be used. For the manufacturing method, a vapor growth method such as a plasma CVD and a thermal CVD method, or sputtering can be used. In addition, a droplet-discharging method, or printing (a method in which a pattern is formed, such as screen printing or offset printing) can also be used. A TOF film, an SOG film, or the like obtained by coating can also be used.

Further, after a composition is discharged to form a conductive layer, an insulating layer, or the like by a droplet-discharging method, the surface may be pressed with pressure to be planarized in order to increase planarity. As a method for pressing, asperity may be reduced so as to even by scanning a roller-shaped object on the surface, or the surface may be pressed perpendicularly with a flat, plate-like object. At the time of pressing, a heating process may be performed. Further, the surface may be softened or dissolved by a solvent or the like, and the asperity portion of the surface may be removed with an air knife. Moreover, a CMP method may be used to be polished. This process can be applied to a case where the surface is to be planarized when asperity occurs as a result of a droplet-discharging method.

Figure 13:
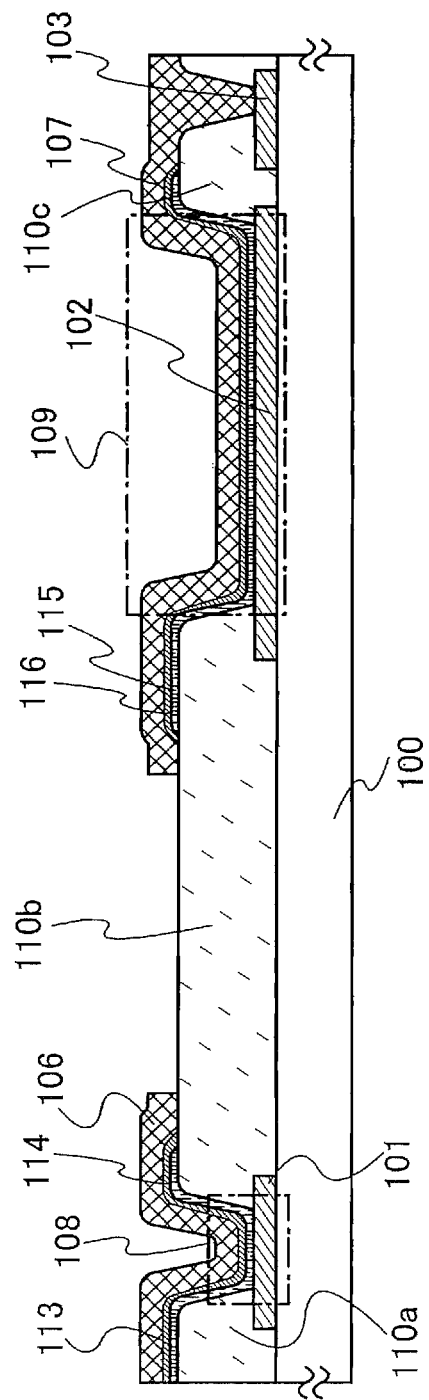
FIG. 13 is a cross-sectional view showing an embodiment mode of the invention.

FIG. 13 shows an example in which a memory element portion and a capacitor are formed using a plurality of organic compound layers.

In FIG. 13, as for the memory element 108, a first layer containing an organic compound 113 is formed over the first conductive layer 101, a second layer containing an organic compound 114 is formed in a shape to cover the first layer containing the organic compound 113 over the first layer containing the organic compound 113, and the second conductive layer 106 is formed over the second layer containing the organic compound 114. Further, as for the capacitor 109, a first layer containing an organic compound 115 is formed over the first conductive layer 102, a second layer containing an organic compound 116 is formed in a shape to cover the first layer containing the organic compound 115 over the first layer containing the organic compound 115, and the second conductive layer 107 is formed over the second layer containing the organic compound 116.

Further, in a case where either a memory element or a capacitor is formed with a stacked layer, a second layer containing an organic compound may be formed selectively between the first layer containing an organic compound and the second conductive layer.

In addition, in the aforementioned structure of this embodiment mode, an element having a rectifying property may be provided between the first conductive layer 101 and the layer containing the organic compound 104 of the memory element 108. A transistor in which a gate electrode is connected to a drain electrode, or a diode may be used as the element having the rectifying property. When the element having the rectifying property is provided as above, a current flows only to one direction, thereby errors decrease and a read margin improves. Note that the element having the rectifying property may be provided between the layer containing the organic compound 104 and the second conductive layer 106.

The partition layers 110a, 110b, and 110c have the function to prevent the first conductive layer 101 and the second conductive layer 106, or the first conductive layer 102 and the second conductive layer 107 from being contacted directly as describe above; however, in a case where the thickness of the first conductive layer is thin enough not to disconnect the layer containing the organic compound in a region in which a level difference is produced such as an end portion, one part or all of the partition layers 110a, 110b, and 110c can be removed.

Figures 2A, 2B:
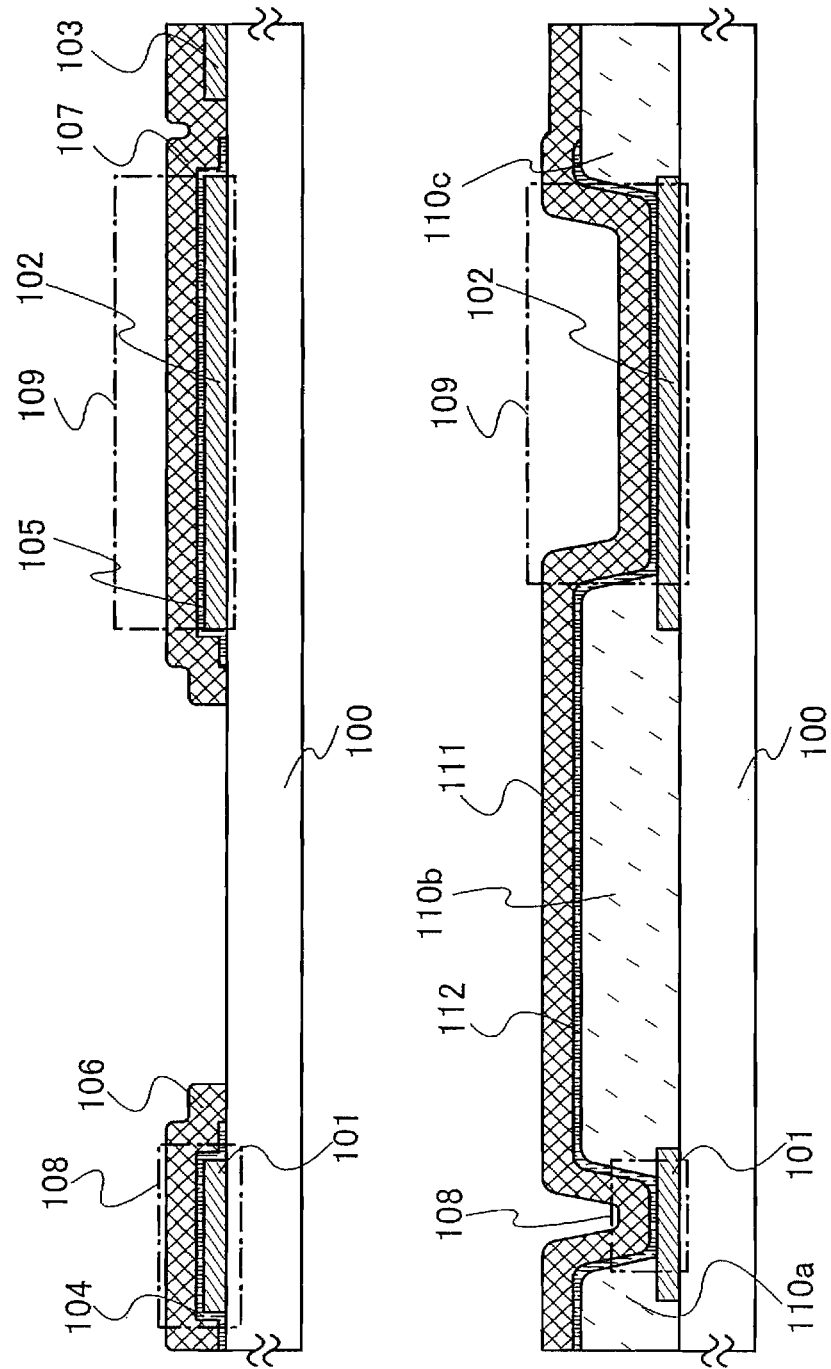
FIGS. 2A and 2B are cross-sectional views each showing an embodiment mode of the invention.

FIG. 2A shows a structural example of a semiconductor device with a structure without a partition layer. In FIG. 2A, the memory element 108 is formed so that an entire surface of the first conductive layer 101 is covered with the layer containing the organic compound 104, and the second conductive layer 106 is formed to cover the layer containing the organic compound 104. The capacitor 109 is similarly formed such that the first conductive layer 102 is covered with the layer containing the organic compound 105, and the second conductive layer 107 is formed to cover the layer containing the organic compound 105. Not forming a partition layer contributes to simplification of a process.

Note that the second conductive layers 106 and 107 are electrically separated generally; however, in a case where one electrode of the memory element portion and one electrode of the capacitor have the same potential, the second conductive layers 106 and 107 may be connected.

FIG. 2B shows a structural example of a semiconductor device with such a structure. In the memory element 108 and the capacitor 109, a common layer containing an organic compound and a common second conductive layer are used in FIG. 2B. The memory element 108 has a stacked-layer structure of the first conductive layer 101, a layer containing an organic compound 112, and a second conductive layer 111, while the capacitor 109 has a stacked-layer structure of the first conductive layer 102, the layer containing the organic compound 112 and the second conductive layer 111. In a case where one electrode of the memory element portion and one electrode of the capacitor have the same potential, such a structure may be used.

By using such a structure, a memory element and a capacitor can be formed over the same substrate at the same time without increasing a process.

(Embodiment Mode 2)

One structural example of a semiconductor device composed of a memory element in which a layer containing an organic compound is provided between two conductive layers and a capacitor in which the layer containing the organic compound which is the same as in the memory element is provided between two conductive layers is described with reference to drawings in this embodiment mode which is different from Embodiment Mode 1.

Figure 3:
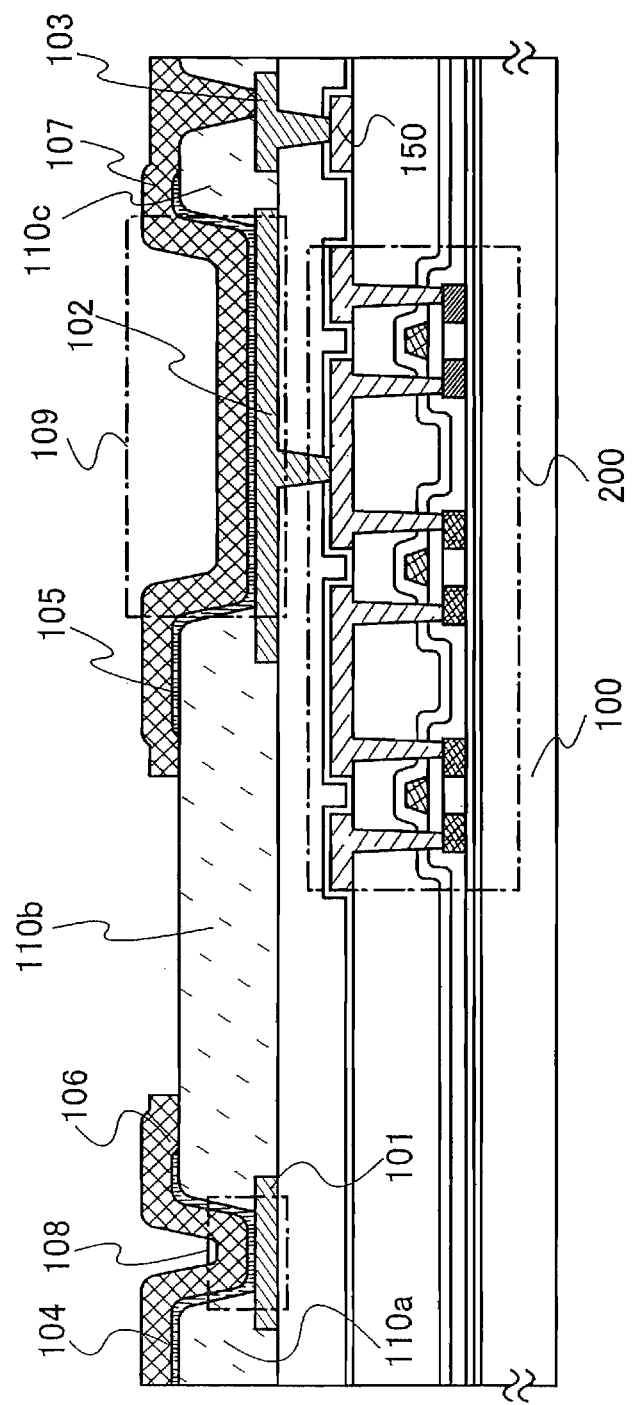
FIG. 3 is a cross-sectional view showing an embodiment mode of the invention.

The structure in which the memory element 108 and the capacitor 109 are provided over the substrate 100 is shown in FIG. 1; however, the invention is not limited to this, and a transistor group 200 is provided over the substrate 100, and the memory element 108 and the capacitor 109 may be formed thereover as shown in FIG. 3. FIG. 3 shows a structure in which the capacitor 109 is formed just above the transistor group 200, and one end of an electrode is connected to a wiring 150. Accordingly, the capacitor 109 functions as capacity between the transistor group 200 and the wiring 150.

A thin film transistor (TFT) is provided in the transistor group 200 in FIG. 3; however, this is an example, and as long as a known structure, any kind of structure may be used. For example, a CMOS transistor or a field effect transistor can be used. Further, any kind of structure may be used for a structure of the semiconductor layer included in the transistor group 200, and for example, an impurity region (including a source region, a drain region, and an LDD region) may be formed, and any one of a P-channel type and an N-channel type may be employed.

In addition, a channel forming region of the transistor may be a single gate structure formed of one channel forming region, a double gate structure formed of two channel forming regions, or a triple gate structure formed of three channel forming regions. When the invention and a single gate structure are combined, a further miniaturized semiconductor device can be obtained. Further, when the invention is combined with a double gate or a triple gate structure, variation of off current can be reduced further and a semiconductor device with high reliability can be obtained.

Further, an insulating layer (side wall) may be formed so as to be in contact with a side surface of a gate electrode, or a silicide layer may be formed to one or both of a source and drain region, and a gate electrode. As a material for the silicide layer, nickel, tungsten, molybdenum, cobalt, platinum, or the like can be used.

Note that here, an example in which the memory element 108 and the capacitor 109 are formed over the transistor group 200 is described; however, the memory element 108 and the capacitor 109, and the transistor group 200 may be manufactured in separate processes and may be adhered to each other with a conductive film or the like.

Figure 4:
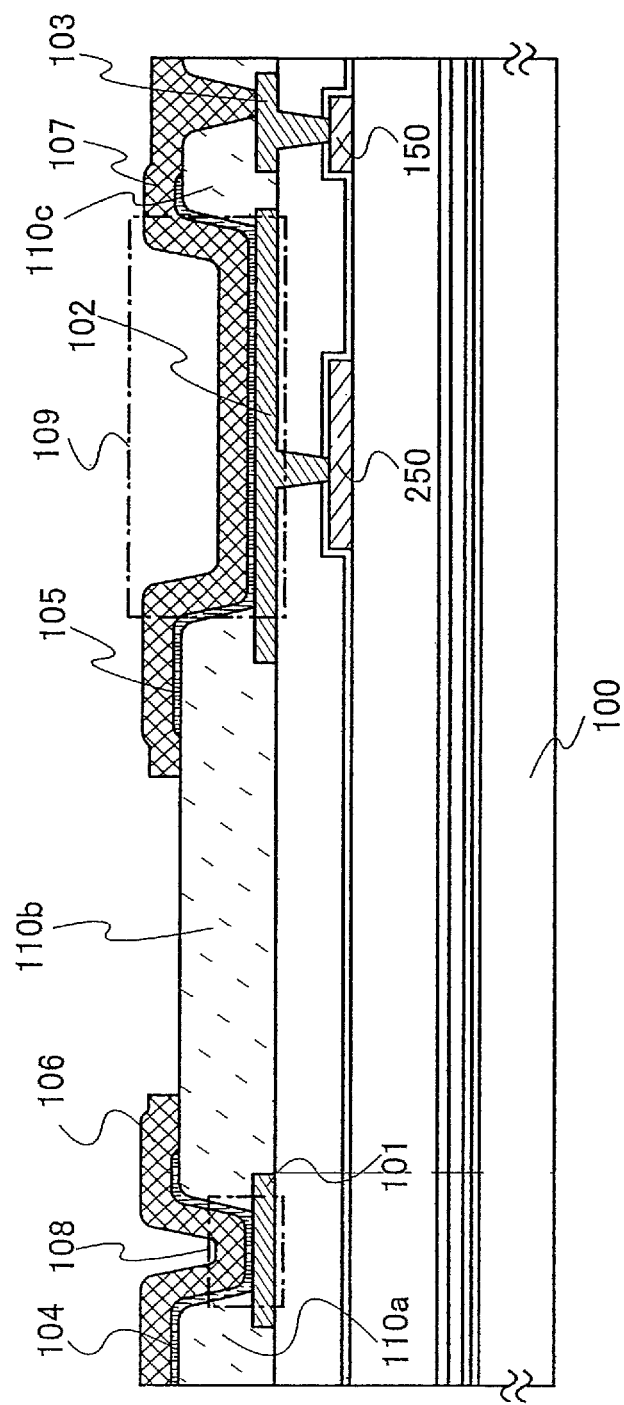
FIG. 4 is a cross-sectional view showing an embodiment mode of the invention.

Further, an example in which the capacitor 109 is formed just above the transistor group 200 to be connected is shown in FIG. 3; however, not limited to a transistor, a wiring may be used for being connected to the capacitor. FIG. 4 shows an example in which the capacitor is formed just above a wiring to be connected.

FIG. 4 shows a structure in which the capacitor 109 is formed just above a wiring 250, and a second conductive layer of the capacitor 109 is connected to the wiring 150 through the first conductive layer 103. Accordingly, the capacitor 109 functions as capacity between the wiring 150 and the wiring 250.

Figure 5:
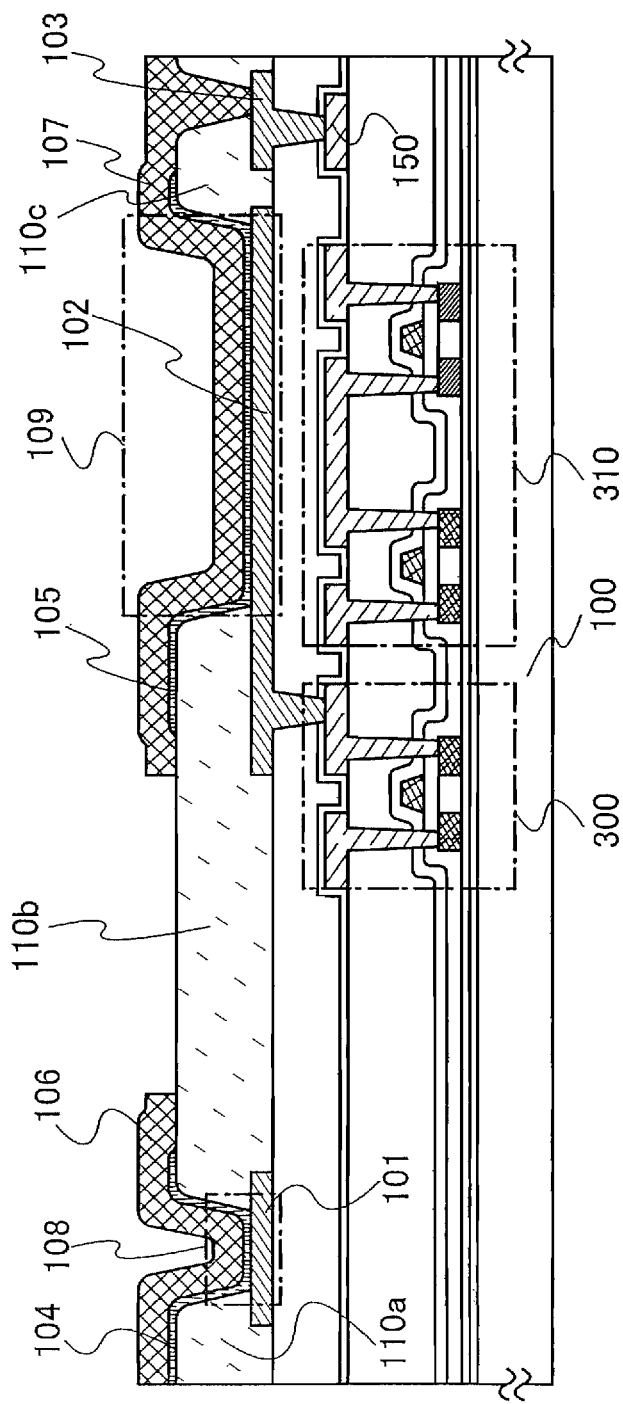
FIG. 5 is a cross-sectional view showing an embodiment mode of the invention.

Furthermore, a region for forming the capacitor is not necessarily over a transistor or a wiring which is not to be connected directly, and can be determined arbitrarily. FIG. 5 is a view showing an example in which the memory element 108 and the capacitor 109 are formed over a transistor 300 and a transistor group 310. The capacitor 109 is formed just above the transistor group 310 which is not connected to the capacitor 109 in FIG. 5.

Figure 6:
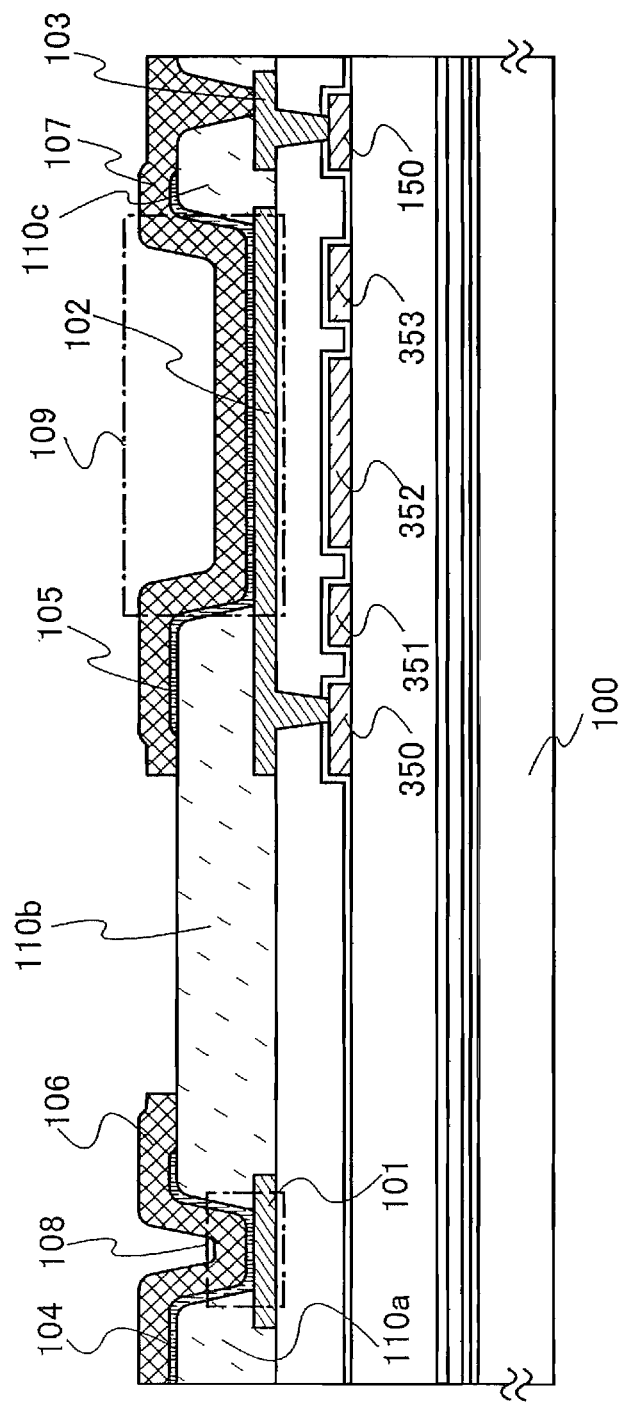
FIG. 6 is a cross-sectional view showing an embodiment mode of the invention.

Similarly, the capacitor can also be formed just above a wiring which is not directly connected to the capacitor FIG. 6 is a view showing an example in which the memory element 108 and the capacitor 109 are formed over the wiring 150, and wirings 350, 351, 352 and 353. The capacitor 109 is formed just above the wirings 351, 352, and 353 which are not connected to the capacitor 109 in FIG. 6.

By using such a structure shown in FIG. 5 or FIG. 6, the capacitor of the invention can also be formed just above a circuit and a wiring which are not directly connected.

As described above, by using such a structure described in this embodiment mode, all or one part of a conventional capacitor using a semiconductor layer and a gate electrode is reduced and the capacitor can be provided over a circuit or a wiring. As a result, it can contribute to the reduction of area of a semiconductor device.

(Embodiment Mode 3)

One structural example of a semiconductor device composed of a memory element in which a layer containing an organic compound is provided between two conductive layers and a capacitor in which the layer containing the organic compound as in the memory element is provided between two conductive layers is described with reference to a drawing in this embodiment mode which is different from Embodiment Modes 1 and 2.

Figure 7:
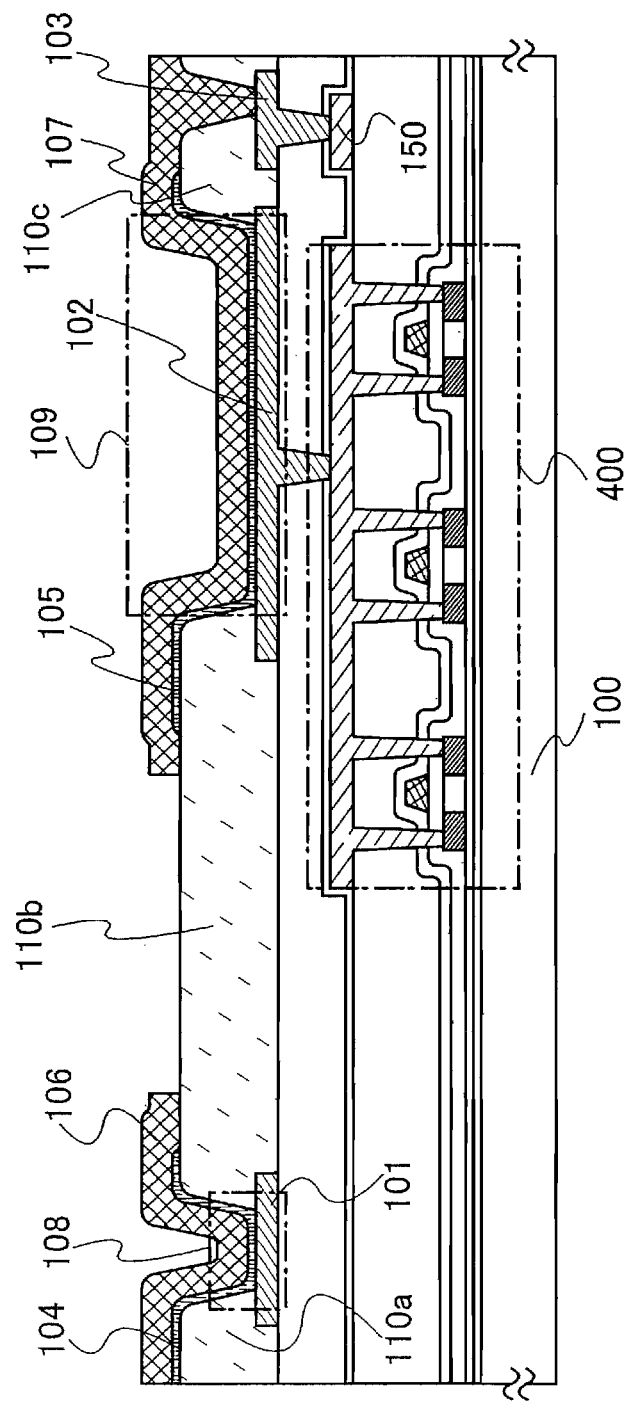
FIG. 7 is a cross-sectional view showing an embodiment mode of the invention.

The capacitor of the invention can achieve the increase of capacity by combining an existing capacitor. FIG. 7 is an example in which a conventional capacitor using a semiconductor layer and a gate metal is combined with the capacitor of the invention.

In the example shown in FIG. 7, an existing capacitor 400 is formed over the substrate 100, and the memory element 108 and the capacitor 109 are formed thereover. The capacitor 400 is a capacitor which is used conventionally and in which a source electrode layer and a drain electrode layer of a TFT are connected so that the capacitor 400 functions as a capacitor using capacity between a semiconductor layer and a gate electrode.

Further, the wiring 150 and the gate electrode in the existing capacitor 400 are connected to each other so that capacity of the existing capacitor 400 and capacity of the capacitor 109 are combined is generated between the wiring 150 and a drain-source electrode of the existing capacitor 400.

By using such a structure, a capacitor and a conventional capacitor using a semiconductor layer and a gate electrode can be used at the same time. Therefore, capacity can be increased without increasing a chip area than conventional one, so that improvement of a circuit function can be achieved.

Further, a capacitor to be used can be selected depending on a voltage applied to an element. For example, a capacitor to be used may be changed depending on a region, such that an existing capacitor is used for capacity in one region where the capacitor of the invention is damaged when a high voltage is generated, while the capacitor of the invention is used for capacity in the other region where a low voltage is used.

Moreover, by combining the aforementioned embodiment mode, a conventional capacitor is reduced and the capacitor of the invention is greatly increased, so that a chip area is reduced and function improvement can be carried out.

(Embodiment Mode 4)

A structural example of an RFID chip in which the capacitor and the organic memory as described in the aforementioned embodiment mode are formed and on which an antenna is mounted is described with reference to drawings.

In the RFID chip described in this embodiment mode, there is a feature that non-contact reading and writing of data is possible. The data transmission methods are classified broadly into three, which is an electromagnetic coupling method for communicating by mutual induction with a pair of coils disposed in the opposed positions, an electromagnetic induction method for communicating by an induction field, and an electric wave method for communicating by using electric waves. Any of these methods may be employed. In addition, an antenna used for transmitting of data can be provided in two ways. In one way, the antenna is provided over a substrate provided with a plurality of elements and memory elements. In the other way, a terminal portion is provided over a substrate provided with a plurality of elements and memory elements, and the antenna provided to another substrate is provided by being connected to the terminal portion.

First, one structural example of an RFID chip in a case where an antenna is provided over a substrate provided with a plurality of elements and memory elements is described with reference to drawings.

Figure 8:
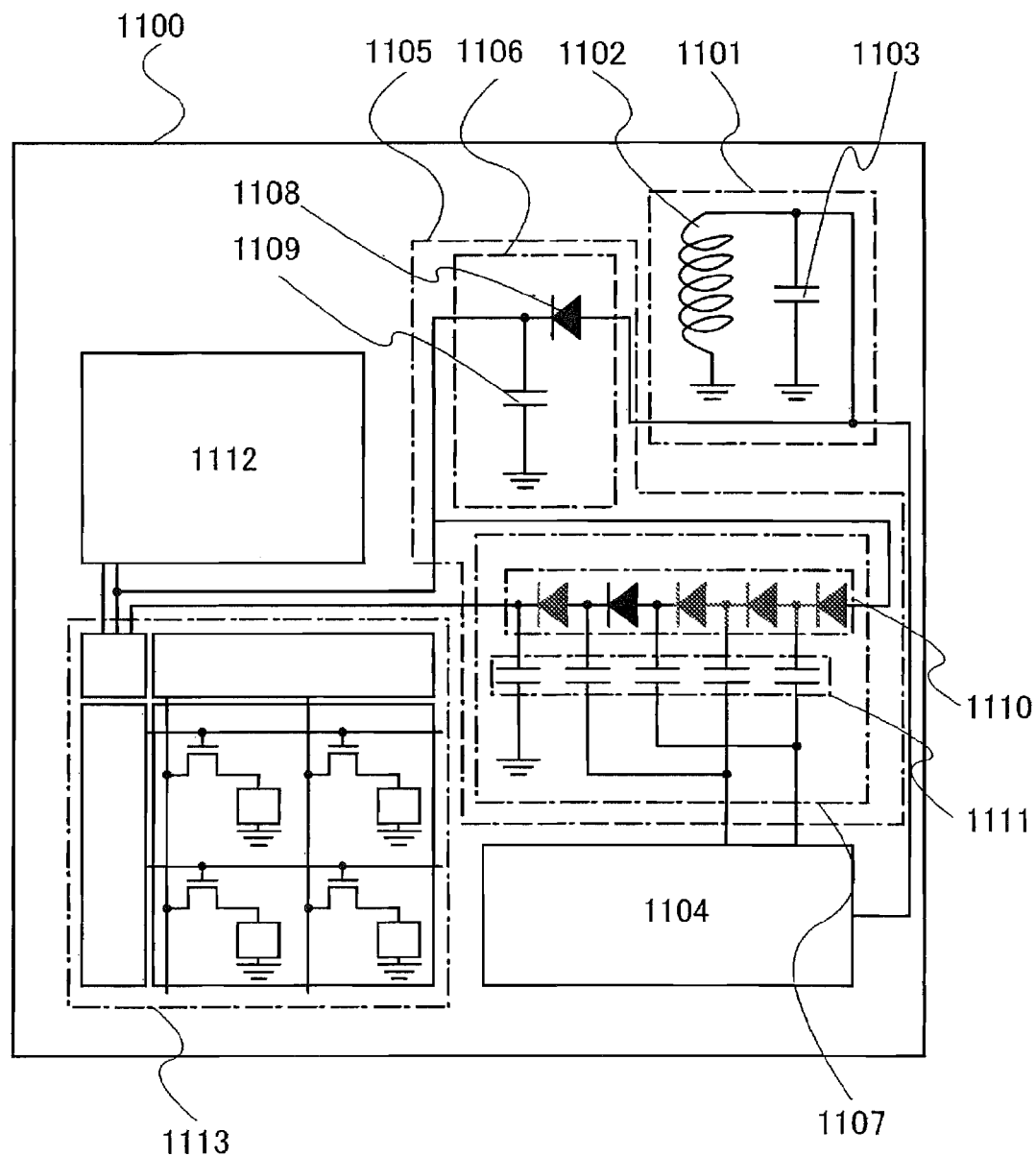
FIG. 8 is a schematic diagram of an RFID chip.

FIG. 8 is a schematic diagram of an RFID chip. As shown in FIG. 8, an antenna circuit 1101, a clock generation circuit 1104, a power supply circuit 1105, a control circuit 1112, and a memory circuit 1113 are provided over a substrate 1100. The antenna circuit 1101 has an antenna 1102 and a resonant capacitor 1103, while the power supply circuit 1105 has a smoothing circuit 1106 and a boosting circuit 1107. In addition, the smoothing circuit 1106 has a diode 1108 and a smoothing capacitor 1109 for rectifying an alternating current signal, while the boosting circuit 1107 has a diode group 1110 and a capacitor group 1111 for boosting a voltage. Although not shown, a data modulation/demodulation circuit, a sensor, an interface circuit, or the like may be provided besides the above circuits.

By the invention, one part or all of the resonant capacitor 1103, the smoothing capacitor 1109, and the capacitor group 1111 can be replaced with a capacitor using a conductive layer and an organic compound which form an organic memory as the aforementioned embodiment mode.

However, in a case where the structure of the invention is applied in a region where a high voltage as much as a memory element can be destroyed is applied, such as in a last stage of the capacitor group 1111, it is necessary to take a means which does not destroy the capacitor using the conductive layer and the organic compound which form the organic memory. For example, the thickness of an insulating layer of the capacitor in a corresponding portion is increased locally, the insulating layer of the capacitor in the corresponding portion is replaced with another insulating layer, another insulating layer is added, or the like.

Of course, it may be replaced with a conventional capacitor; the replacement of a capacitor to correspond with an area of use is not limited to the aforementioned example and can be applied for all capacitors in a circuit provided with a capacitor in a chip.

Figure 9A:
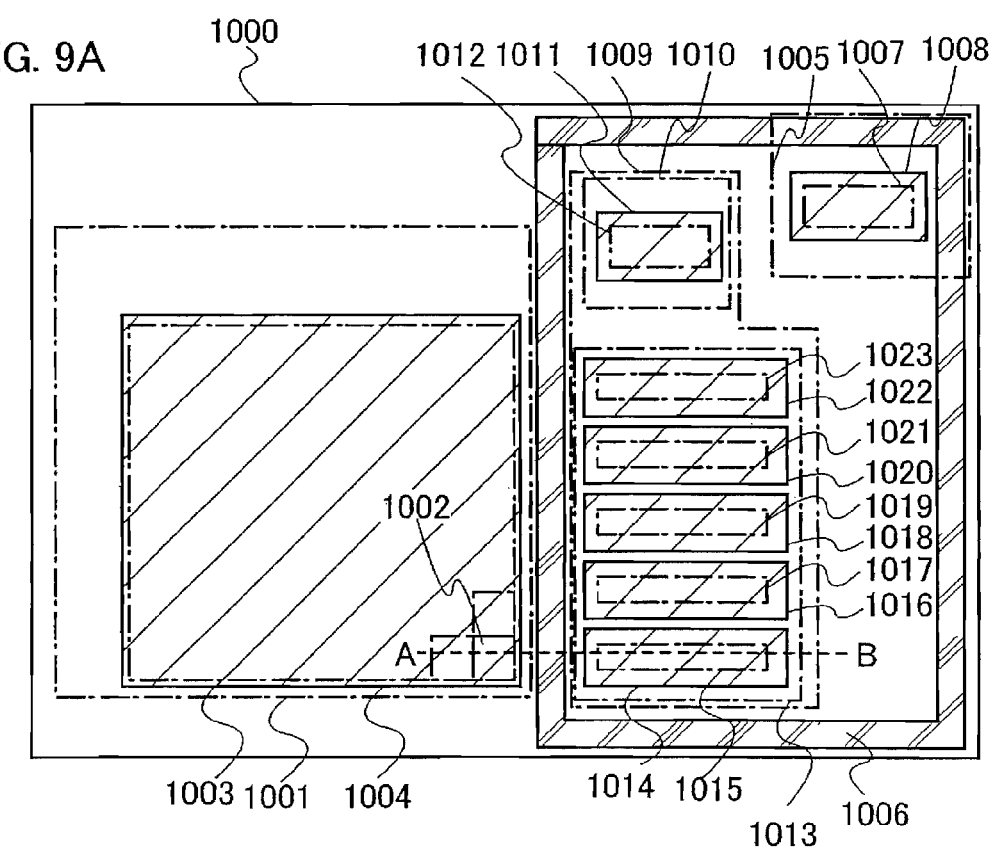
FIGS. 9A and 9B are schematic diagrams showing an RFID chip mounting an active matrix memory.

FIG. 9A is a top view of an RFID chip having a memory device composed of an active matrix type, and is a diagram which shows a location where a conductive layer which is used as an upper electrode of a memory element and an upper electrode of the capacitor of the invention, and a conductive layer functioning as an antenna are formed when seen from above. A memory 1001, an antenna circuit 1005, and a power supply circuit 1009 are provided over a substrate 1000 in FIG. 9A. Although not shown, a control circuit and a clock generation circuit are provided besides the above circuits, and a data modulation/demodulation circuit, a sensor, an interface circuit, or the like may be provided.

The memory 1001 has a memory cell array 1003 in which a plurality of memory cells 1002 are provided, and a conductive layer 1004 is formed in a shape to cover the memory cell array 1003. The antenna circuit 1005 has an antenna 1006 and a resonant capacitor 1007, and a conductive layer 1008 is formed in a shape to cover the resonant capacitor 1007. The power supply circuit 1009 has a smoothing circuit 1010 and a boosting circuit 1013. The smoothing circuit 1010 also has a smoothing circuit 1012, and a conductive layer 1011 is formed in a shape to cover the smoothing circuit 1012. The boosting circuit 1013 has capacitors 1015, 1017, 1019, 1021, and 1023, and conductive layers 1014, 1016, 1018, 1020, and 1022 are formed in a shape to cover the respective capacitors.

All the conductive layers 1004, 1008, 1011, 1014, 1016, 1018, 1020, and 1022 are formed of the same material in the same process at the same time.

Note that the antenna 1006 has a shape to surround the resonant capacitor 1007 and the power supply circuit 1009; however, this is an example and the shape of a real antenna is not limited to this. Further, the structure such as the number, the shape, or the arrangement of the formed capacitor is an example, and a structure of the real capacitor is not limited to this.

Figure 9B:
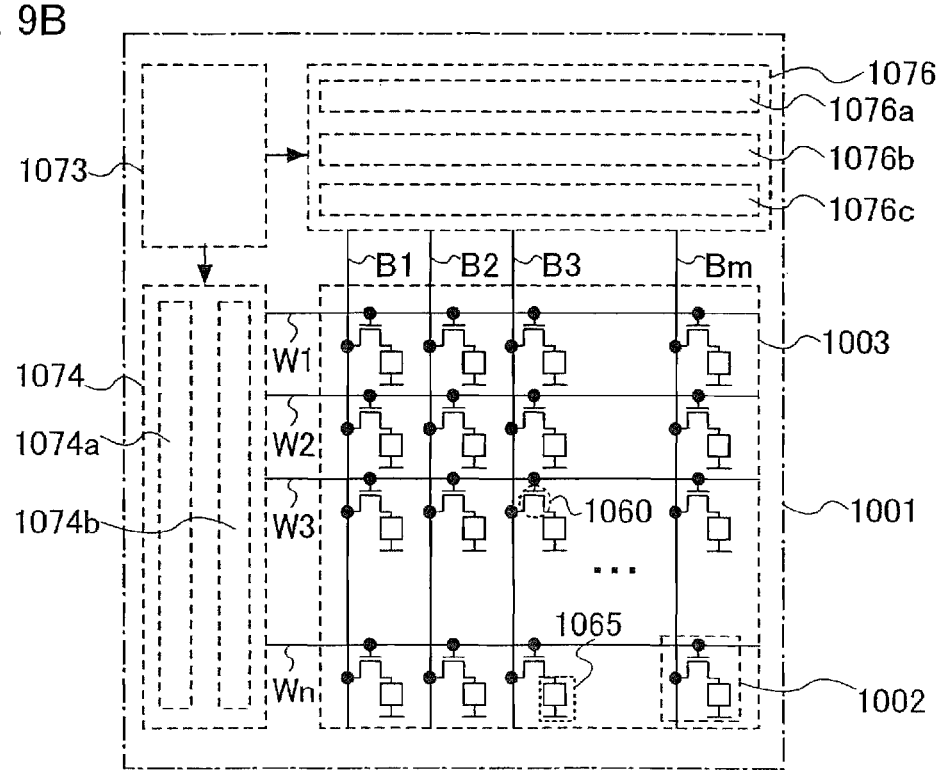

FIG. 9B shows one structural example of a memory device composed of an active matrix type. The memory device has the memory cell array 1003 provided with the memory cells 1002 in matrix, a bit line driver circuit 1076 having a column decoder 1076*a*, a read circuit 1076*b*, and a selector 1076*c*, a word line driver circuit 1074 having a row decoder 1074*a* and a level shifter 1074*b*, and an interface 1073 having a write circuit or the like and performing exchanges outside. Note that the structure of the memory 1001 described here is an example, and another circuit such as a sense amplifier, an output circuit, or a buffer may be provided, and the write circuit may be provided in the bit line driver circuit.

The memory cell 1002 has a first conductive layer forming a word line Wy ($1 \le y \le n$), a second conductive layer forming a bit line Bx ($1 \le x \le m$), a transistor 1060, and a memory element 1065. The memory element 1065 has a structure in which an organic compound layer is sandwiched between the first and second conductive layers.

Figure 10:
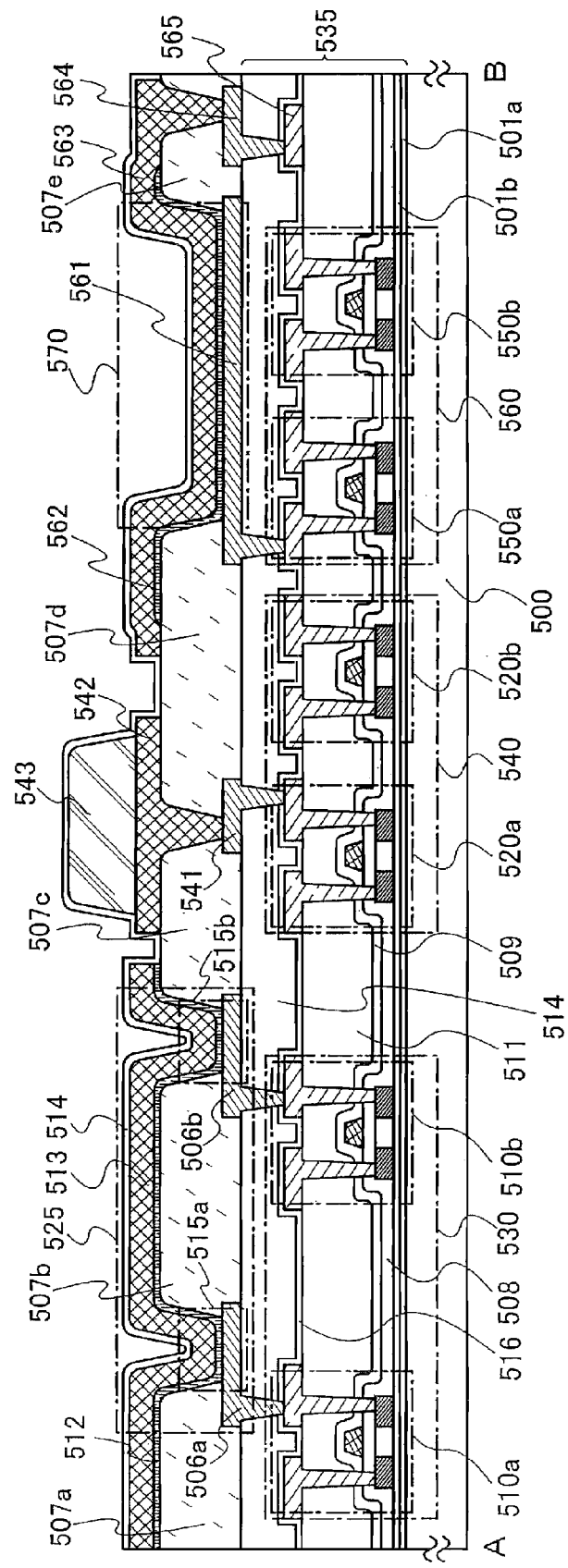
FIG. 10 is a cross-sectional view showing an embodiment mode of the invention.

FIG. 10 is a view which shows a cross sectional structure along a line A-B in FIG. 9A. FIG. 10 shows a semiconductor device having the memory device composed of the active matrix type. A transistor portion 530 having transistors 510a and 510b, a transistor portion 540 having transistors 520a and 520b, a transistor portion 560 having transistors 550a and 550b, and an element forming layer 535 including insulating layers 501a, 501b, 508, 509, 511, 516, and 514 are provided over a substrate 500, and above the element forming layer 535, a memory element portion 525, a capacitor 570 which is formed of the same material as the memory element, and a conductive layer 543 functioning as an antenna are provided.

Note that here, described is a case where the memory element portion 525, the capacitor 570, and the conductive layer 543 functioning as an antenna are provided above the element forming layer 535; however, the invention is not limited to this structure, and the memory element portion 525, the capacitor 570, and the conductive layer 543 functioning as an antenna can also be provided to a layer below the element forming layer 535.

The memory element portion 525 is composed of memory elements 515a and 515b. The memory element 515a is composed by stacking a partition layer (insulating layer) 507a, a partition layer (insulating layer) 507b, a layer containing an organic compound 512, and a second conductive layer 513 over a first conductive layer 506a. The memory element 515b is provided by stacking the partition layer (insulating layer) 507b, a partition layer (insulating layer) 507c, the layer containing the organic compound 512, and the second conductive layer 513 over a first conductive layer 506b. Further, the insulating layer 514 functioning as a protective film is formed covering the second conductive layer 513.

Further, the first conductive layer 506a and the first conductive layer 506b over which the memory element 515a and the memory element 515b are formed are connected to source or drain electrode layers of the transistor 510a and the transistor 510, respectively. That is, each memory element is connected to each one transistor. Further, the layer containing the organic compound 512 is formed over an entire surface so as to cover the first conductive layers 506a and 506b and the partition layers (insulating layers) 507a, 507b, and 507c; however, it may be formed selectively for each memory cell. Note that the memory elements 515a and 515b can be formed using the material or the manufacturing method described in the aforementioned embodiment mode.

By applying a voltage to the first conductive layers 506a and 506b and the second conductive layer 513, a current flows to the layer containing the organic compound 512. Accordingly, the temperature of the layer containing the organic compound 512 rises by Joule heat, the layer containing the organic compound 512 is fluidized, and a composition having fluidity moves without keeping a solid state shape. Accordingly, the thickness of the layer containing the organic compound 512 becomes uneven, the layer containing the organic compound 512 is transformed, and the first conductive layers 506a and 506b and the second conductive layer 513 are short-circuited. Accordingly, the conductivity of a memory element changes before and after a voltage is applied.

Reading of data is performed by reading a change of conductivity in each memory element. An example of a reading method is described with reference to FIGS. 12A and 12B.

Figure 12A:
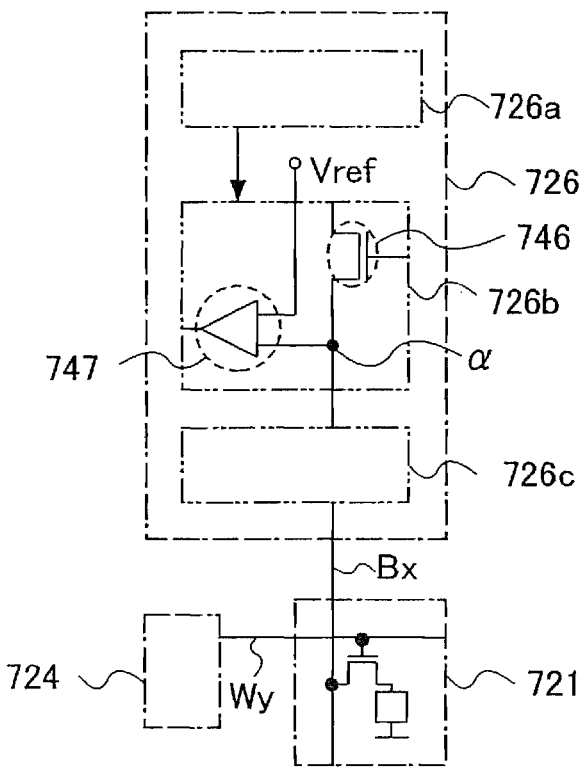
FIGS. 12A and 12B are schematic diagrams showing reading of an active matrix memory.

FIG. 12A is a pattern diagram of a memory element of an active matrix type and a driver circuit thereof, which is composed of a word line driver circuit 724, a bit line driver circuit 726, and a memory element portion 721 in which a bit line Bx and a word line Wy are connected. The bit line driver circuit 726 includes a column decoder 726a, a read circuit 726b, and a selector 726c. Further, the read circuit 726b has a sense amplifier 747 and a resistance element 746. Note that the structure shown here is just an example, and another circuit such as an output circuit or a buffer may be provided or the write circuit may be provided in the bit line driver circuit.

Figure 12B:
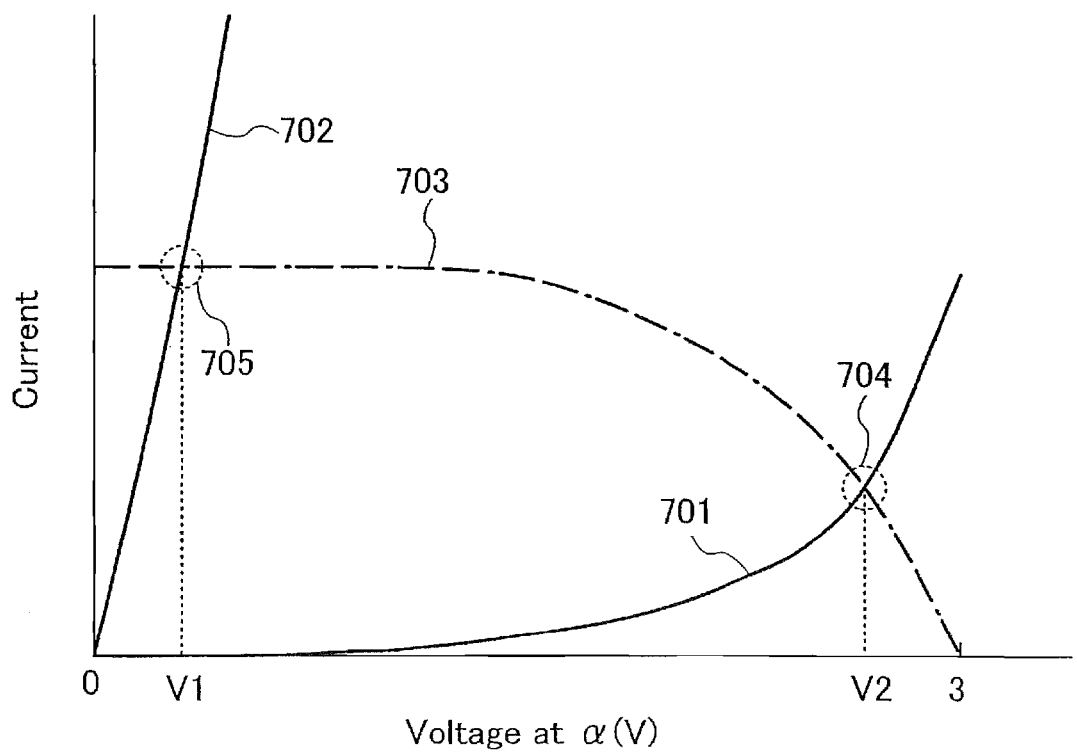

FIG. 12B shows a current voltage characteristic 701 of a memory element portion in which data "0" is written to a memory element portion, a current voltage characteristic 702 of the memory element portion in which data "1" is written, and a current voltage characteristic 703 of the resistance element 746, and here a case of using a transistor for the resistance element 746 is shown. In addition, a case where 3 V is applied between the first conductive layer 506a and the second conductive layer 513 as an operating voltage when reading out data is described.

In FIG. 12B, in a memory cell having the memory element portion, in which data "0" is written, an intersection point 704 of the current voltage characteristic 701 of the memory element portion with the current voltage characteristic 703 of the transistor is an operating point. In this case, a potential of a node α becomes V2 (V). A potential of the node α is supplied to the sense amplifier 747. In the sense amplifier 747, data stored in the memory cell is determined as "0".

On the other hand, in a memory cell having the memory element, in which the data "1" is written, an intersection point 705 of the current voltage characteristic 702 of the memory element with the current voltage characteristic 703 of the transistor is an operation point. In this case, the potential of the node α becomes V1 (V) (V 1>V2). The potential of the node α is supplied to the sense amplifier 747. In the sense amplifier 747, data stored in the memory cell is determined as "1".

By reading out a potential which is subjected to resistance division to correspond with a resistance value of the memory element portion 721, data stored in the memory cell can be determined.

Moreover, in the memory element 515a, an element having a rectifying property may be provided between the first conductive layer 506a and the layer containing the organic compound 512, or between the layer containing the organic compound 512 and the second conductive layer 513. The element having the rectifying property is a transistor in which a gate electrode and a drain electrode are connected, or a diode. For example, a PN junction diode which is provided by stacking an N-type semiconductor layer and a P-type semiconductor layer can be used. In this manner, by providing a diode having a rectifying property, a current flows only to one direction, thereby errors decrease and a read margin improves. Note that when a diode is provided, a diode with a different structure such as a diode having a PIN junction or an avalanche diode may be used instead of the diode having a PN junction. Note that the same is applied to the memory element 515b.

The capacitor 570 is provided by stacking a partition layer (insulating layer) 507d, a partition layer (insulating layer) 507e, a layer containing an organic compound 562 formed in the same layer as the layer containing the organic compound 512, and a second conductive layer 563 formed in the same layer as the second conductive layer 513, over a first conductive layer 561 formed in the same layer as the first conductive layers 506a and 506b. Further, the insulating layer 514 functioning as a protective film is formed covering the second conductive layer 563. Moreover, the second conductive layer 563 is connected to a wiring 565 through a conductive layer 564 separated from the first conductive layer 561, and is connected to another circuit through the wiring 565. By using such a structure, a capacitor can be provided just above a transistor or a wiring.

The conductive layer 543 functioning as an antenna is provided over a conductive layer 542 formed in the same layer as the second conductive layer 513. Note that a conductive layer functioning as an antenna may be formed in the same layer as the second conductive layer 513. Further, the conductive layer 542 is provided over a conductive layer 541 formed in the same layer as the first conductive layers 506a and 506b. The conductive layer 541 is connected to a source electrode layer or a drain electrode layer of the transistor 520a.

As a material of the conductive layer 543 functioning as an antenna, one kind of element selected from among gold (Au), platinum (Pt), nickel (Ni), tungsten (W), molybdenum (Mo), cobalt (Co), copper (Cu), aluminum (Al), manganese (Mn), titanium (Ti), or the like, or an alloy containing a plurality of the elements, or the like can be used. As the manufacturing method of the conductive layer 543 functioning as an antenna, evaporation, sputtering, CVD, various kinds of printing methods such as screen printing or gravure printing, a droplet-discharging method, or the like can be used.

The transistors 510a, 510b, 520a, 520b, 550a, and 550b included in the element forming layer 535 can be provided by a P-channel TFT, an N-channel TFT, or a CMOS combining them. In addition, any kind of structure may be used for the structure of the semiconductor layer included in each of the transistors 510a, 510b, 520a, 520b, 550a, and 550b, and for example, an impurity region (including a source region, a drain region, and an LDD region) may be formed, and either a P-channel type or an N-channel type may be used to form the semiconductor layer. Further, an insulating layer (side wall) may be formed so as to be in contact with a side surface of a gate electrode, or a silicide layer may be provided to one or both of a source region and a drain region and a gate electrode. As a material for the silicide layer, nickel, tungsten, molybdenum, cobalt, platinum, or the like can be used.

Moreover, in the transistors 510a, 510b, 520a, 520b, 550a, and 550b included in the element forming layer 535, various semiconductors such as an amorphous semiconductor, a crystalline semiconductor, a polycrystalline semiconductor, or a microcrystalline semiconductor can be used in each semiconductor layer. An organic transistor having a semiconductor layer formed of an organic compound may be provided as the transistors 510a, 510b, 520a, 520b, 550a, and 550b. In this case, the element forming layer 535 formed of an organic transistor can be formed by using a direct printing method, a droplet-discharging method or the like over a substrate having flexibility such as plastics as the substrate 500. The element forming layer is formed by using printing or a droplet-discharging method, a semiconductor device can be formed at low cost.

In addition, the element forming layer 535, the memory elements 515a and 515b, the capacitor 570, and the conductive layer 543 functioning as an antenna can be formed using evaporation, spattering, CVD, printing, a droplet-discharging method or the like as mentioned above. Note that different methods may be used for each region. For example, a transistor required a high speed operation is crystallized by heat treatment to be provided after forming a semiconductor layer composed of Si or the like over a substrate, and then, a transistor functioning as a switching element can be provided as an organic transistor above an element forming layer by using printing or a droplet-discharging method.

Note that a sensor may be provided to be connected to the transistors. As a sensor, an element which detects temperature, humidity, illuminance, gas, gravity, pressure, sound (vibration), acceleration, and other characteristics by physical means or chemical means can be given. The sensor is typically formed using a semiconductor element such as a resistance element, a capacitive coupling element, an inductive coupling element, a photovoltaic element, a photoelectric conversion element, a thermoelectromotive force element, a transistor, a thermistor, or a diode.

Next, one structural example of a semiconductor device in a case where a terminal portion is provided over a substrate provided with a plurality of elements and memory elements, and an antenna provided over another substrate is connected to the terminal portion is described with reference to FIG. 11.

Figure 11:
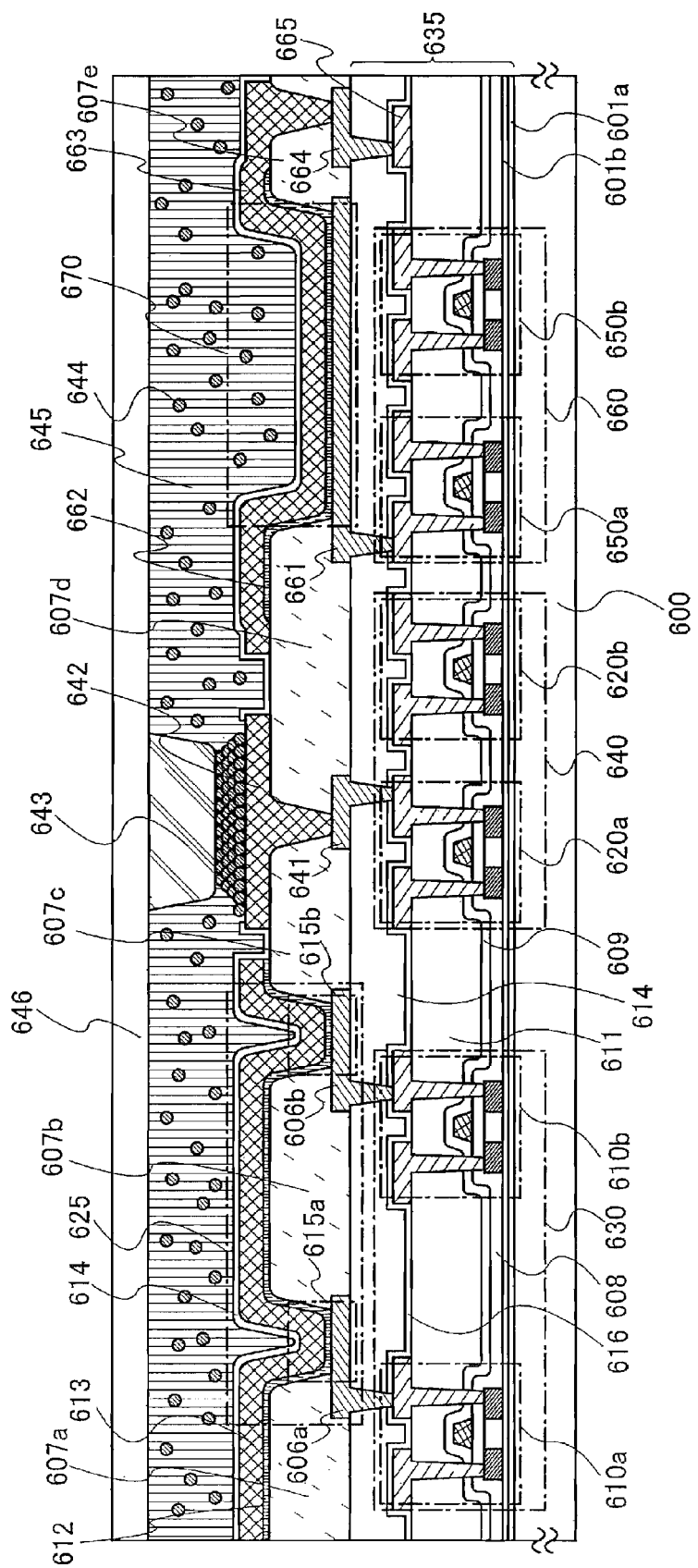
FIG. 11 is a cross-sectional view showing an embodiment mode of the invention.

FIG. 11 shows a semiconductor device having an active matrix type memory device. A transistor portion 630 having transistors 610a and 610b, a transistor portion 640 having transistors 620a and transistor 620b, a transistor portion 660 having transistors 650a and 650b, and an element forming layer 635 including insulating layers 601a, 601b, 608, 609, 611, 616, and 614 are provided over a substrate 600. Further, a memory element portion 625 and a capacitor 670 formed by using a material of the memory element are provided above the element forming layer 635. Furthermore, a conductive layer 643 functioning as an antenna provided to a substrate 646 is provided so as to be connected to the element forming layer 635.

Note that here, described is a case where the memory element portion 625 or the conductive layer 643 functioning as an antenna is provided above the element forming layer 635; however, the invention is not limited to this structure, and the memory element portion 625, the capacitor 670, and the conductive layer 643 functioning as an antenna can also be provided to a layer below the element forming layer 635.

The memory element portion 625 is composed of memory elements 615a and 615b. The memory element 615a is composed by stacking a partition layer (insulating layer) 607a, a partition layer (insulating layer) 607b, a layer containing an organic compound 612, and a second conductive layer 613 over a first conductive layer 606a. The memory element 615b is provided by stacking the partition layer (insulating layer) 607b, a partition layer (insulating layer) 607c, the layer containing the organic compound 612, and the second conductive layer 613 over a first conductive layer 606b. Further, the insulating layer 614 functioning as a protective film is formed covering the second conductive layer 613.

Further, the first conductive layer 606a and the first conductive layer 606b over which the memory element 615a and the memory element 615b are formed are connected to source or drain electrode layers of the transistor 610a and the transistor 610b, respectively. That is, each memory element is connected to each one transistor. Further, the layer containing the organic compound 612 is formed over an entire surface so as to cover the first conductive layers 606a and 606b and the partition layers (insulating layers) 607a, 607b, and 607c; however, it may be formed selectively for each memory cell. Note that the memory elements 615a and 615b can be formed using the material or the manufacturing method described in the aforementioned embodiment mode.

By applying a voltage to the first conductive layers 606a and 606b and the second conductive layer 613, a current flows to the layer containing the organic compound 612. Accordingly, the temperature of the layer containing the organic compound 612 rises by Joule heat, the layer containing the organic compound 612 is fluidized, and a composition having fluidity moves without keeping a solid state shape. Accordingly, the thickness of the layer containing the organic compound 612 becomes uneven, the layer containing the organic compound 612 is transformed, and the first conductive layers 606a and 606b and the second conductive layer 613 are short-circuited. Accordingly, the conductivity of a memory element changes before and after a voltage is applied.

Reading of data is performed by reading a change of conductivity in each memory element as described before.

Moreover, in the memory element 615a, an element having a rectifying property may be provided between the first conductive layer 606a and the layer containing the organic compound 612, or between the layer containing the organic compound 612 and the second conductive layer 613. The element having the rectifying property is a transistor in which a gate electrode and a drain electrode are connected, or a diode. For example, a PN junction diode which is provided by stacking an N-type semiconductor layer and a P-type semiconductor layer can be used. In this manner, by providing a diode having a rectifying property, a current flows only to one direction, thereby errors decrease and a read margin improves. Note that when a diode is provided, a diode with a different structure such as a diode having a PIN junction or an avalanche diode may be used instead of the diode having a PN junction. Note that the same is applied to the memory element 615b.

The capacitor 670 is provided by stacking a partition layer (insulating layer) 607d, a partition layer (insulating layer) 607e, a layer containing an organic compound 662 formed in the same layer as the layer containing the organic compound 612, and a second conductive layer 663 formed in the same layer as the second conductive layer 613, over a first conductive layer 661 formed in the same layer as the first conductive layers 606a and 606b. Further, the insulating layer 614 functioning as a protective film is formed covering the second conductive layer 663. Moreover, the second conductive layer 663 is connected to a wiring 665 through a conductive layer 664 separated from the first conductive layer 661, and is connected to another circuit through the wiring 665. By using such a structure, a capacitor can be provided just above a transistor or a wiring.

The substrate 600 provided with the element forming layer 635, the memory element portion 625, and the capacitor 670 is attached to the substrate 646 provided with the conductive layer 643 functioning as an antenna with an adhesive resin 645. The element forming layer 635 and the conductive layer 643 are electrically connected through conductive fine particles 644 contained in the resin 645. Alternatively, the substrate 600 provided with the element forming layer 635, the memory element portion 625, and the capacitor 670 may be attached to the substrate 646 provided with the conductive layer 643 functioning as an antenna by using a conductive adhesive such as silver paste, copper paste, or carbon paste, or by using solder bonding.

As a material of the conductive layer 643 functioning as an antenna, one kind of element selected from among gold (Au), platinum (Pt), nickel (Ni), tungsten (W), molybdenum (Mo), cobalt (Co), copper (Cu), aluminum (Al), manganese (Mn), titanium (Ti), or the like, or an alloy containing a plurality of the elements, or the like can be used. As the manufacturing method of the conductive layer 643, evaporation, sputtering, CVD, various kinds of printing methods such as screen printing, or gravure printing, a droplet-discharging method, or the like can be used.

In this manner, a memory device using a capacitor formed just above a wiring or a transistor and an RFID chip provided with an antenna can be formed. Further, in this embodiment mode, a thin film transistor may be formed over a substrate to provide an element forming layer, or a semiconductor substrate such as Si may be used as a substrate and a field effect transistor may be formed over the substrate to provide an element forming layer may be provided. In addition, an SOI substrate may be used as a substrate and an element forming layer may be provided thereover. In this case, the SOI substrate may be formed by using a method for attaching wafers or a method referred to as SIMOX by which an insulating layer is formed inside by implanting oxygen ions into a Si substrate.

Besides, the memory element portion and the capacitor may be provided over a substrate provided with a conductive layer functioning as an antenna. Further, a sensor connected to a transistor may be provided.

Note that in this embodiment mode, an application of an active matrix memory is described; however, the same application is possible to a passive matrix memory formed by a known method.

Figure 17A:
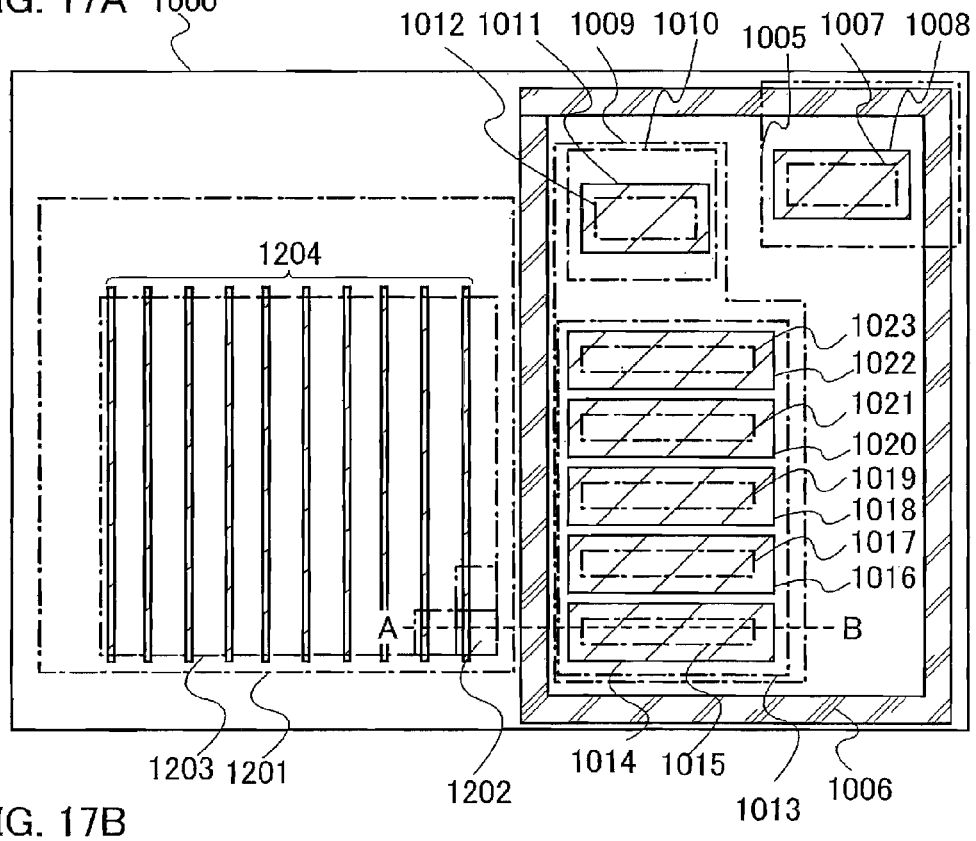
FIGS. 17A and 17B are schematic diagrams showing an RFID chip mounting a passive matrix memory.

FIG. 17A is a top view of an RFID chip having a memory device composed of a passive matrix type, and is a diagram, which shows a location where a conductive layer which is used as an upper electrode of a memory element and an upper electrode of the capacitor of the invention, and a conductive layer functioning as an antenna are formed, when seen from above. A memory 1201, the antenna circuit 1005, and the power supply circuit 1009 are provided over the substrate 1000 in FIG. 17A. Although not shown, a control circuit and a clock generation circuit are provided besides the above circuits, and a data modulation/demodulation circuit, a sensor, an interface circuit, or the like may be provided.

The memory 1201 has a memory cell array 1203 in which a plurality of memory cells 1202 is provided, and each of conductive layers 1204 is formed to extend and over one column of memory cells. At this time, the number of the conductive layers 1204 is equivalent to the number of rows of memory cells. The conductive layer 1204 is formed of the same material in the same process as the conductive layers 1008, 1011, 1014, 1016, 1018, 1020, and 1022 at the same time.

Note that the conductive layer 1204 is formed to extend and over one column of memory cells in FIG. 17A; however, the invention is not limited to this shape, the conductive layer 1204 may be formed to extend and over one row of memory cells.

Figure 17B:
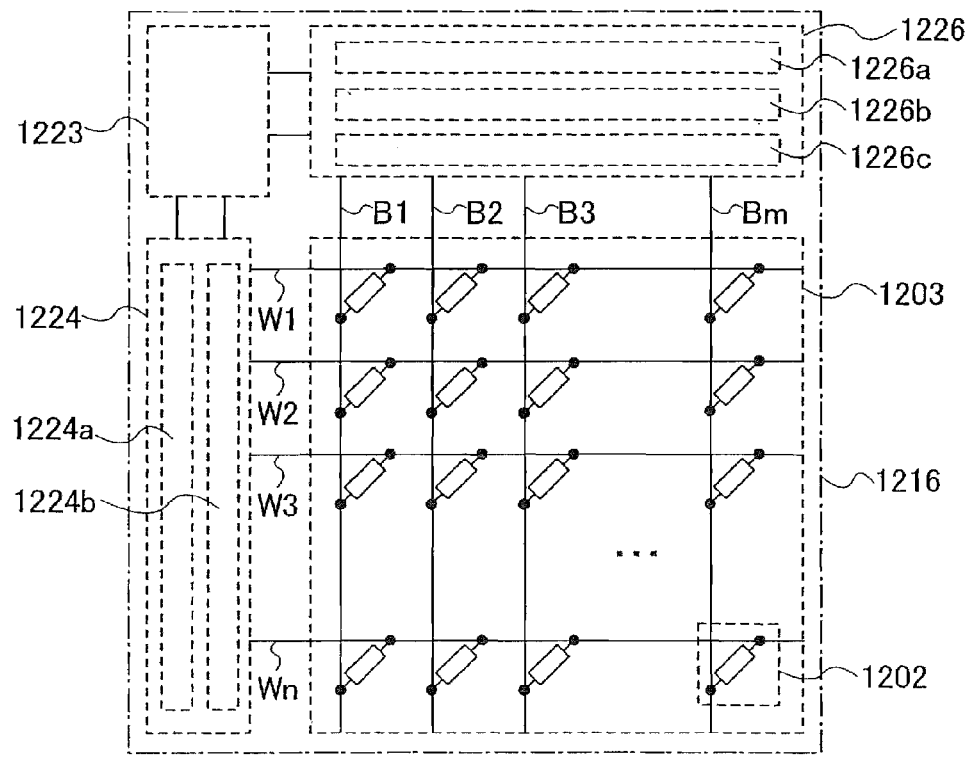

FIG. 17B shows one structural example of a memory device composed of a passive matrix type. The memory device has the memory cell array 1203 provided with the memory cells 1202 in matrix, a bit line driver circuit 1226 having a column decoder 1226a, a read circuit 1226b, and a selector 1226c, a word line driver circuit 1224 having a row decoder 1224a and a level shifter 1224b, and an interface 1223 having a write circuit or the like and performing exchanges outside. Note that the structure of the memory 1201 described here is an example, and another circuit such as a sense amplifier, an output circuit, or a buffer may be provided, and the write circuit may be provided in the bit line driver circuit.

The memory cell 1202 has a first conductive layer forming a word line Wy ($1 \leq y \leq n$), a second conductive layer forming a bit line Bx ($1 \leq x \leq m$), and a layer containing an organic compound. The layer containing the organic compound may be formed in a single layer structure or a stacked-layer structure between the first conductive layer and the second conductive layer.

Figure 18:
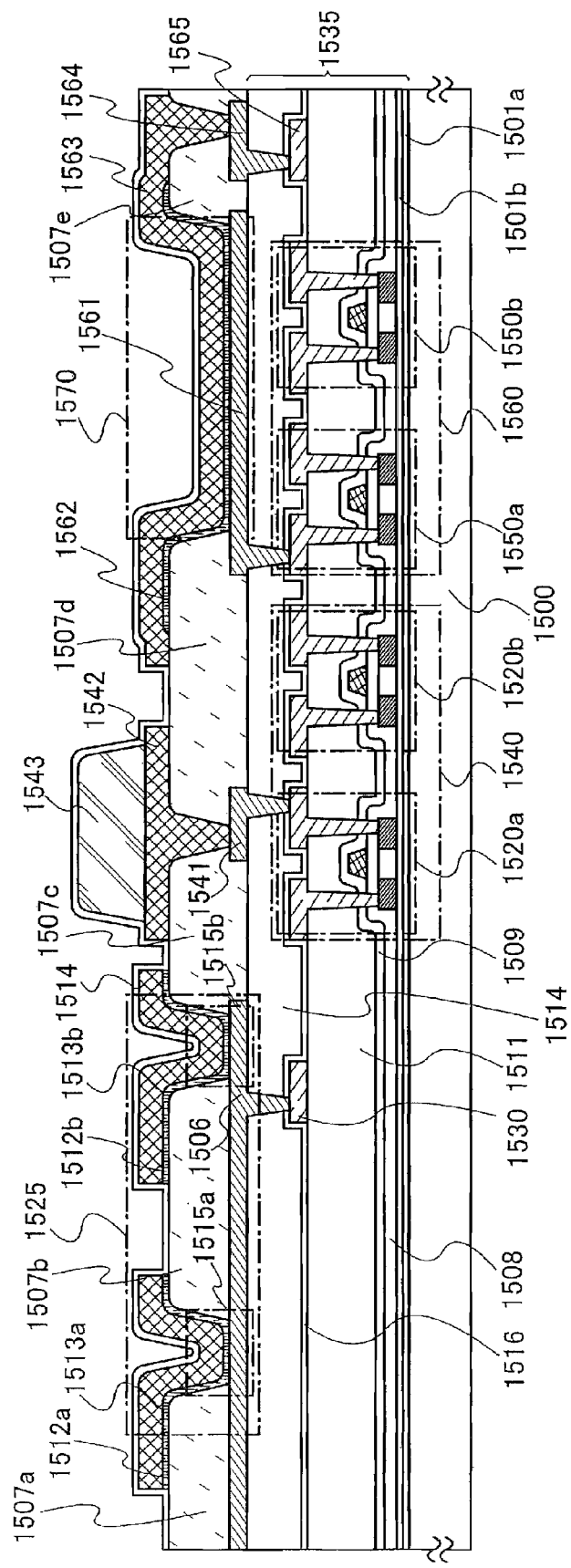
FIG. 18 is a cross-sectional view showing an embodiment mode of the invention.

FIG. 18 is a view which shows a cross sectional structure along a line A-B in FIG. 17A. FIG. 18 shows a semiconductor device having the memory device composed of a passive matrix type. A transistor portion 1540 having transistors 1520*a* and 1520*b*, a transistor portion 1560 having transistors 1550*a* and 1550*b*, and an element forming layer 1535 including insulating layers 1501*a*, 1501*b*, 1508, 1509, 1511, 1516, and 1514 are provided over a substrate 1500. In addition, a memory element portion 1525, a capacitor 1570 formed of the same material as the memory element, and a conductive layer 1543 functioning as an antenna are provided above the element forming layer 1535.

Note that here, described is a case where the memory element portion 1525, the capacitor 1570, and the conductive layer 1543 functioning as an antenna are provided above the element forming layer 1535; however, the invention is not limited to this structure, and the memory element portion 1525, the capacitor 1570, and the conductive layer 1543 functioning as an antenna can also be provided to a layer below the element forming layer 1535.

The memory element portion 1525 is composed of memory elements 1515*a* and 1515*b*. The memory element 1515*a* is composed by stacking a partition (insulating layer) 1507*a*, a partition (insulating layer) 1507*b*, a layer containing an organic compound 1512*a*, and a second conductive layer 1513*a* over a first conductive layer 1506. The memory element 1515*b* is provided by stacking the partition (insulating layer) 1507*b*, a partition (insulating layer) 1507*c*, a layer containing an organic compound 1512*b*, and a second conductive layer 1513*b* over the first conductive layer 1506. Further, the insulating layer 1514 functioning as a protective film is formed covering the second conductive layers 1513*a* and 1513*b*. The first conductive layer 1506 in which the memory element 1515*a* and the memory element 1515*b* are formed is connected to a wiring 1530. That is, the first conductive layer 1506 functions as a word line and the second conductive layers 1513*a* and 1513*b* function as a bit line.

Figure 19:
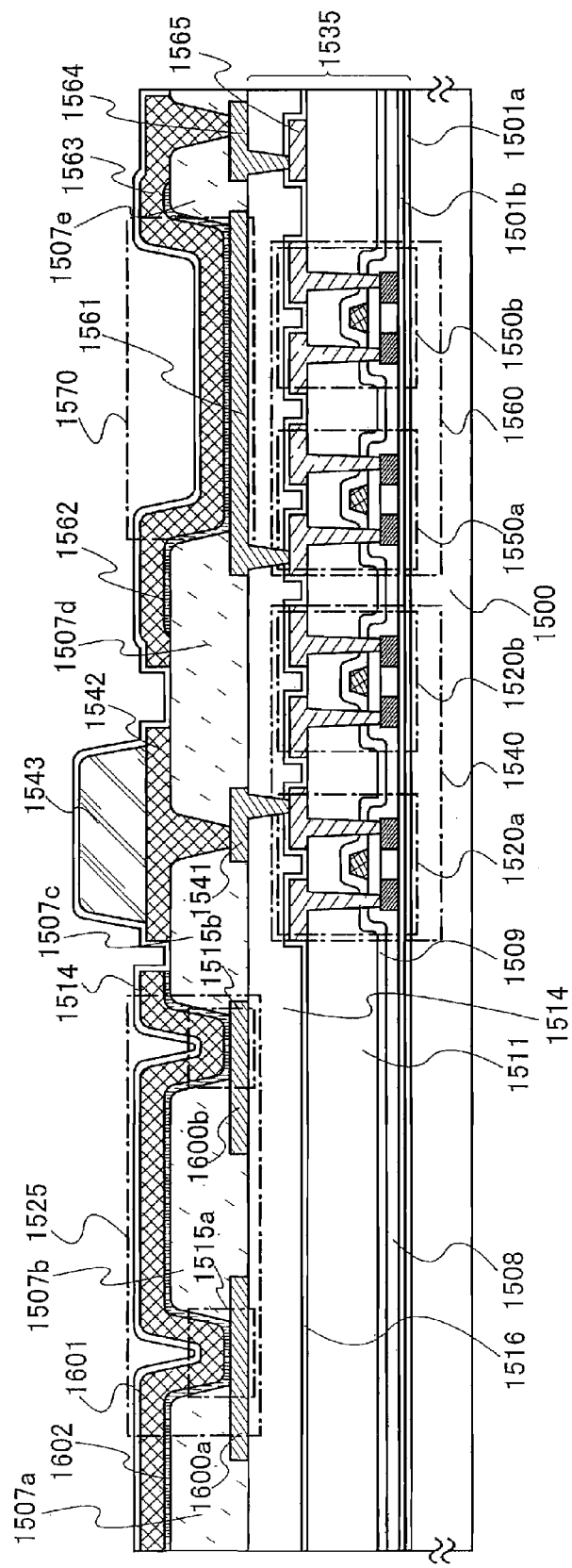
FIG. 19 is a cross-sectional view showing an embodiment mode of the invention.

Of course, a structure in which the first conductive layer is used as a bit line, and the second conductive layer is used as a word line may also be used. A structural example formed as such is shown in FIG. 19. In FIG. 19, first conductive layers 1600*a* and 1600*b* are used as a bit line and a second conductive layer 1601 is used as a word line. A layer containing an organic compound 1602 formed between the first conductive layers 1600*a* and 1600*b* and the second conductive layer 1601 may be divided for each memory element.

Note that the element forming layer 1535, the memory element portion 1525, the capacitor 1570, and the conductive layer 1543 functioning as an antenna can be formed using the material or the manufacturing method described in the aforementioned embodiment mode.

Further, the RFID chip manufactured in this embodiment mode is peeled off by a known peeling process from a substrate and adhered to a flexible substrate, so that the RFID chip can be provided over the flexible substrate and a semiconductor device having flexibility can be obtained. The flexible substrate corresponds to a film made of polypropylene, polyester, vinyl, polyvinyl fluoride, polyvinyl chloride, or the like, paper made from a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like. The film may be obtained by performing heat treatment and pressure treatment. In performing heat treatment and pressure treatment, an adhesive layer provided on the outermost surface of the film, or a layer (not an adhesive layer) provided on the outermost layer of the film and melted by heat treatment is attached by applying pressure. An adhesive layer may be provided over the substrate or not. The adhesive layer corresponds to a layer containing an adhesive such as a heat curable resin, an ultraviolet-curable resin, an epoxy resin-based adhesive, or a resin additive.

By applying the capacitor and the organic memory of the invention as is in this embodiment mode, a capacitor can be formed just above a wiring or a transistor, and the capacitor can be formed at the same time as the organic memory is formed. In this manner, by forming a capacitor just above a wiring or a transistor, reduction of area and improvement of properties through increased capacity are achieved, and a memory device and an RFID chip provided with an antenna which have both advantages can be provided.

(Embodiment Mode 5)

A manufacturing method of a semiconductor device of the invention including a thin film transistor, a memory element, a capacitor, and an antenna is described with reference to FIGS. 14 to 16 in this embodiment mode.

Figure 14A:
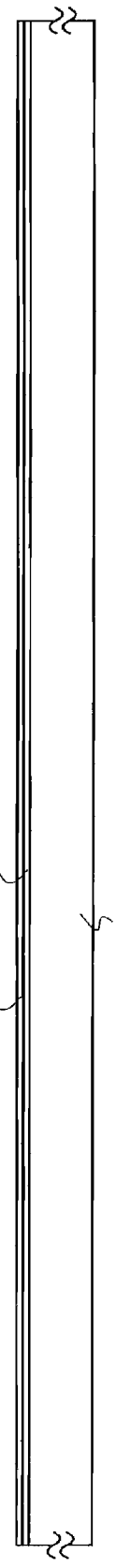
FIGS. 14A to 14D are cross-sectional views each showing a step for forming a circuit of the invention.

First, insulating layers 2001 and 2002 each serving as a base are formed over a substrate 2000 (FIG. 14A). The substrate 2000 may be formed of an insulating layer which is formed over one surface of a glass substrate, a quartz substrate, a metal substrate or a stainless substrate, or of a plastic substrate having heat resistance which can withstand the treatment temperature of this process, or the like. As long as this kind of substrate 2000 is used, there is no significant limitation on an area or a shape thereof. Accordingly, when a rectangular substrate having a side of one meter or more is used as the substrate 2000, for example, productivity can be improved dramatically. This kind of advantage means it is significantly superiority to the case of using a circular silicon substrate. Further, when a peeling layer is used between the substrate 2000 and the insulating layer 2001, a layer having a thin film transistor can be transposed to a substrate which forms a conductive film or the like. As a result, the conductive film connected to the thin film transistor can be easily connected to the conductive film over the different substrate.

Next, the insulating layer 2001 is formed of a silicon nitride oxide layer as a first layer, and the insulating layer 2002 is formed of a silicon oxynitride layer as a second layer. The insulating layers 2001 and 2002 are formed by a layer containing oxide of silicon or nitride of silicon by a known means (sputtering, plasma CVD, or the like). Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. The insulating layer to be a base may be a single layer or a stacked layer, and for example in the case where the insulating layer to be a base has a three-layer structure, a silicon oxide layer, a silicon nitride oxide layer, and a silicon oxynitride layer may be fanned as a first-layer insulating layer, a second-layer insulating layer, and a third-layer insulating layer respectively. Alternatively, a silicon oxynitride layer, a silicon nitride oxide layer, and a silicon oxynitride layer may be formed as a first-layer insulating layer, a second-layer insulating layer, and a third-layer insulating layer respectively. The insulating layer to be a base functions as a blocking film for preventing impurities entering from the substrate 2000.

Figure 14B:
Figure 14C:
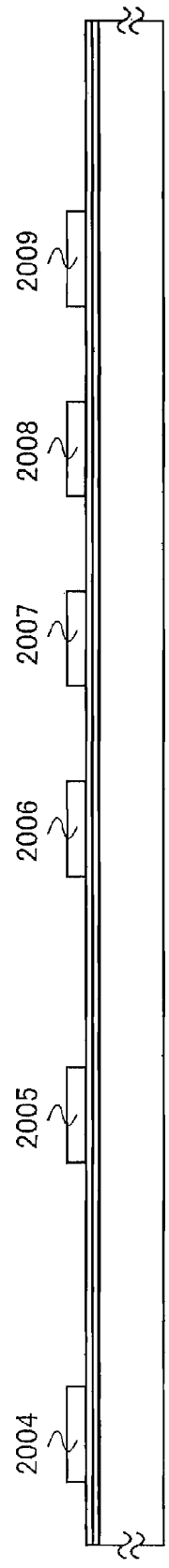

Next, an amorphous semiconductor layer 2003 (for example, a layer containing amorphous silicon) is formed over the insulating layer 2002 (FIG. 14B). The amorphous semiconductor layer 2003 is formed to a thickness of 25 to 200 nm (preferably 30 to 150 nm) by a known means (sputtering, LPCVD, plasma CVD, or the like). Subsequently, the amorphous semiconductor layer 2003 is crystallized by a known crystallization method (a laser crystallization method, a thermal crystallization method using RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor layer. The crystalline semiconductor layer is then patterned into a desired shape, thereby forming crystalline semiconductor layers 2004 to 2009 (FIG. 14C).

An example of a formation process of the crystalline semiconductor layers 2004 to 2009 is described briefly as follows. First, an amorphous semiconductor layer is formed to a thickness of 66 nm by plasma CVD. Next, a solution containing nickel, that is a metal element for promoting crystallization, is applied onto the amorphous semiconductor layer, and dehydrogenation treatment (at 500° C., for 1 hour) and thermal crystallization treatment (at 550° C., for 4 hours) are performed on the amorphous semiconductor layer, thereby a crystalline semiconductor layer is formed. After that, the crystalline semiconductor layer is irradiated with laser light if necessary, and the crystalline semiconductor layers 2004 to 2009 are formed by a patterning treatment using photolithography. In the case where the laser crystallization method is employed for forming the crystalline semiconductor layer, a continuous wave or pulsed gas laser or solid-state laser is used. As the gas laser, an excimer laser, a YAG laser, a $YVO_4$ laser, a YLF laser, a $YAlO_3$ laser, a glass laser, a ruby laser, a Ti: sapphire laser, or the like is used. As the solid-state laser, a laser using a crystal such as YAG, $YVO_4$, YLF, and $YAlO_3$ doped with Cr, Nd, Er, Ho, Ce, Co, Ti, or Tm is used.

In addition, the crystallization of the amorphous semiconductor layer by using the metal element for promoting crystallization is advantageous because the crystallization can be performed at a low temperature in a short time and the direction of crystals becomes uniform. However, there is a problem in that the characteristics are not stable because the off-state current is increased due to a residue of the metal element in the crystalline semiconductor layer. Therefore, it is preferable to form an amorphous semiconductor layer as a gettering site over the crystalline semiconductor layer. It is necessary that the amorphous semiconductor layer to be a gettering site contains an impurity element such as phosphorous or argon; accordingly, it is preferably formed by sputtering by which argon can be contained at a high concentration. Subsequently, heat treatment (RTA, thermal annealing using an annealing furnace, or the like) is performed to diffuse the metal element into the amorphous semiconductor layer, and the amorphous semiconductor layer containing the metal element is removed therefrom. In this manner, the content of the metal element in the crystalline semiconductor layer can be reduced or removed.

Figure 14D:
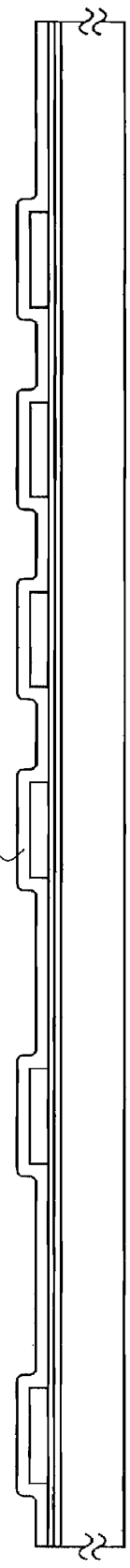

Then, a gate insulating film 2010 is formed to cover the crystalline semiconductor layers 2004 to 2009 (FIG. 14D). The gate insulating film 2010 is formed in a single layer or stacked layers of a layer containing oxide of silicon or nitride of silicon by a known means (plasma CVD or sputtering). Specifically, a layer containing silicon oxide, a layer containing silicon oxynitride, or a layer containing silicon nitride oxide is formed in a single layer or a stacked layer structure.

Subsequently, a first conductive layer and a second conductive layer are stacked over the gate insulating film 2010. The first conductive layer is formed to a thickness of 20 to 100 nm by a known means (plasma CVD or sputtering). The second conductive layer is formed to a thickness of 100 to 400 nm by a known means. The first conductive layer and the second conductive layer are formed by using an element selected from among tantalum (Ta), tungsten (W), titanium (Ti), molybdenum (Mo), aluminum (Al), copper (Cu), chromium (Cr), niobium (Nb), or the like, or by using an alloy material or a compound material containing the above-mentioned elements as its main component. Alternatively, a semiconductor material, typically poly-crystalline silicon doped with an impurity element such as phosphorus, may be used. As a combination of the first conductive layer and the second conductive layer, a tantalum nitride (TaN) layer and a tungsten (W) layer, a tungsten nitride (WN) layer and a tungsten layer, a molybdenum nitride (MoN) layer and a molybdenum (Mo) layer, or the like can be used, for example. Since tungsten and tantalum nitride have high heat resistance, heat treatment for thermal activation can be performed after the first conductive layer and the second conductive layer are formed. Moreover, the invention is not limited to a two-layer structure. A stacked-layer structure of two or more layers, or a single-layer structure may be used. In the case of employing a three-layer structure, a stacked layer structure of a molybdenum layer, an aluminum layer, and a molybdenum layer may be employed.

Further, a transistor having a single drain structure that does not have an LDD is used in this embodiment mode; however, this is an example, and any known structure may be used.

Then, a resist mask is formed using photolithography and etching treatment for forming a gate electrode and a gate wiring is performed; thereby conductive layers (also referred to as gate electrode layers) 2011 to 2016 each functioning as a gate electrode are formed (FIG. 15A).

Next, another resist mask is formed by photolithography. Then, impurity regions 2017b to 2022b of an N-type or a P-type and channel forming regions 2017a to 2022a are formed in the crystalline semiconductor layers 2004 to 2009 by ion doping or ion implantation (FIG. 15B). For example, in a case of imparting N-type conductivity, an element belonging to group 15 of the Periodic Table may be used as the impurity element imparting N-type conductivity. For example, phosphorus (P) or arsenic (As) is used to add an impurity element and an N-type impurity region is formed. Next, in a case of imparting P-type conductivity, another resist mask is formed by photolithography. Then, an impurity element imparting P-type conductivity, for example, boron (B), is added to a desired crystalline semiconductor layer to form a P-type impurity region.

Next, insulating layers 2023 and 2024 are formed so as to cover the gate insulating layer 2010 and the conductive layers 2011 to 2016 (FIG. 15C). The insulating layers 2023 and 2024 are formed of an inorganic material such as oxide of silicon or nitride of silicon, or an organic material such as polyimide, polyamide, benzocyclobutene, acrylic, epoxy or siloxane, by a known means (SOG or a droplet-discharging method). Siloxane is composed of a skeleton formed by a bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Moreover, the insulating layer covering the conductive layer may be a single layer or a stacked layer, and in a case of a three-layer structure, a layer containing silicon oxide may be formed in the first-layer insulating layer, a layer containing a resin may be formed in the second-layer insulating layer, and a layer containing silicone nitride may be formed in the third-layer insulating layer.

Note that before the insulating layers 2023 and 2024 are formed or after one or more of thin films of the insulating layers 2023 and 2024 are formed, heat treatment for recovering the crystallinity of the semiconductor layer, for activating the impurity element which is added into the semiconductor layer, or for hydrogenating the semiconductor layer is preferably performed. For the heat treatment, thermal annealing, laser annealing, RTA or the like is preferably used.

Then, the insulating layers 2023 and 2024 are etched by using photolithography to form contact holes so that the impurity regions 2017b to 2022b are exposed. Subsequently, a conductive layer is formed so as to fill the contact holes and patterned to form conductive layers 2025 to 2037 each functioning as a source or drain wiring (FIG. 15D).

The conductive layers 2025 to 2037 are formed in a single layer or stacked layers by a known means (plasma CVD or sputtering) using an element selected from among titanium (Ti), aluminum (Al), or neodymium (Nd); or an alloy material or a compound material containing the above-mentioned elements as its main component. An alloy material containing aluminum as its main component corresponds to a material containing nickel which has aluminum as its main component or an alloy material containing nickel which has aluminum as its main component and one or both of carbon and silicon, for example. Each of the conductive layers 2025 to 2037 preferably uses, and for example, a stacked layer structure of a barrier layer, an aluminum-silicon (Al—Si) layer and a barrier layer, or a stacked layer structure of a barrier layer, an aluminum-silicon (Al—Si) layer, a titanium nitride (TiN) layer and a barrier layer. Note that a barrier layer corresponds to a thin layer formed using titanium, nitride of titanium, molybdenum, or nitride of molybdenum. Aluminum or aluminum silicon has a low resistance value and is inexpensive, which is an optimal material for forming the conductive layers 2025 to 2037. In addition, generation of a hillock of aluminum or aluminum silicon can be prevented when upper and lower bather layers are provided. Further, when the barrier layer is formed by using titanium that is a highly-reducible element, even when a thin natural oxide film is formed over the crystalline semiconductor layer, the natural oxide film is reduced so that good contact with the crystalline semiconductor layer can be obtained.

Next, insulating layers 2038 and 2039 are formed so as to cover the conductive layers 2025 to 2037 (FIG. 16A). The insulating layers 2038 and 2039 are formed in a single layer or a stacked layer using an inorganic material or an organic material by a known means (an SOG method, a droplet-discharge method, or the like).

Subsequently, the insulating layers 2038 and 2039 are etched by photolithography to form contact holes in which the conductive layers 2025 to 2037 are exposed. Then, a conductive layer is formed so as to fill the contact holes. The conductive layer is formed by a known means (plasma CVD or sputtering) using a conductive material. Next, the conductive layer is patterned to form conductive layers 2040 to 2044 (FIG. 16A). Note that the conductive layers 2040 to 2044 correspond to one of a pair of conductive layers included in a memory element. Therefore, the conductive layers 2040 to 2044 are preferably formed in a single layer or a stacked layer using titanium, or an alloy material or a compound material containing titanium as its main component. Titanium has low resistance, which enables size reduction of the memory element; thereby high integration can be realized. In addition, in a photolithography process for forming the conductive layers 2040 to 2044, it is preferable to perform wet etching in order to prevent damage to the thin film transistor that is a lower layer; hydrogen fluoride (HF) or ammonia peroxide mixture is preferably used as the etchant.

Then, an insulating layer is formed so as to cover the conductive layers 2040 to 2044. The insulating layer is then etched by photolithography to form contact holes in which the conductive layers 2040 to 2044 are exposed. Then, partition layers (insulating layers) 2045 to 2049 are formed. The partition layers 2045 to 2049 are formed in a single layer or a stacked layer using an inorganic material or an organic material by a known means (an SOG method, a droplet-discharge method, or the like). In addition, the partition layers 2045 to 2049 are preferably formed to a thickness of 0.75 μm to 3 μm.

Next, layers containing an organic compound 2050 and 2051 are formed so as to be in contact with the conductive layer 2040, and conductive layers 2041 and 2043 (FIG. 16B). A droplet-discharging method, printing, a spin coat method, or the like can be used for the layers containing the organic compound 2050 and 2051; however, operating efficiency can be improved particularly by using a spin coat method. In a case of using a spin coat method, either a mask is provided in advance, or a photolithography process or the like is used after forming an organic compound layer over an entire surface, enabling an organic compound layer to be provided selectively. Further, by using a droplet-discharging method or printing, usability of the material can be improved.

Subsequently, conductive layers 2052 and 2054 are formed so as to be in contact with the layers containing the organic compound 2050 and 2051 while a conductive layer 2053 is formed so as to be in contact with the conductive layer 2042. The conductive layers 2052 to 2054 can be formed by a known means (plasma CVD, sputtering, printing, or a droplet-discharging method).

Subsequently, a conductive layer 2055 functioning as an antenna which is in contact with the conductive layer 2053 is formed (FIG. 16B). The conductive layer 2055 is formed by a known means (plasma CVD, sputtering, printing, or a droplet-discharge method) using a conductive material. Preferably, the conductive layer 2055 is formed in a single layer or a stacked layer using an element selected from among aluminum (Al), titanium (Ti), silver (Ag), or copper (Cu), or an alloy material or a compound material containing the above-mentioned elements as its main component. Specifically, the conductive layer 2055 is formed by screen printing using a paste containing silver, and heat treatment is conducted thereafter at 50° C. to 350° C. Alternatively, an aluminum layer is formed by sputtering, and is patterned to than the conductive layer 2055. The patterning of the aluminum layer is preferably performed by wet etching, and heat treatment at 200° C. to 300° C. is preferably conducted after the wet etching.

Next, an insulating layer 2056 functioning as a protective film is provided so as to cover the conductive layers 2052 to 2055 (FIG. 16B). The insulating layer 2056 can be formed in a single layer or a stacked layer structure by using a droplet-discharging method, printing, a spin coat method, or the like.

Through the above-described process, a memory element portion formed by stacking the conductive layer 2040, the layer containing the organic compound 2050 and the conductive layer 2052, a memory element portion formed by stacking the conductive layer 2041, the layer containing the organic compound 2050 and the conductive layer 2052, and a capacitor formed by stacking the conductive layer 2043, the layer containing the organic compound 2051 and the conductive layer 2054 can be completed. Accordingly, a semiconductor device forming a circuit including a memory element of an active matrix type and a capacitor can be formed.

By manufacturing a capacitor and an organic memory of the invention according to this embodiment mode, a capacitor can be formed just above a wiring or a transistor, and the capacitor can be formed at the same time as the organic memory is formed. In this manner, by forming a capacitor just above a wiring or a transistor, reduction of area, and improvement of properties through increased capacity are achieved, and a memory device and an RFID chip provided with an antenna which have both advantages can be provided.

[Embodiment 1]

An application of an RFID chip which is formed by using embodiment modes in this embodiment is described with reference to the drawings. Further, a manufacturing method of a transistor which is different from that in the aforementioned embodiment modes is described.

Figure 20:
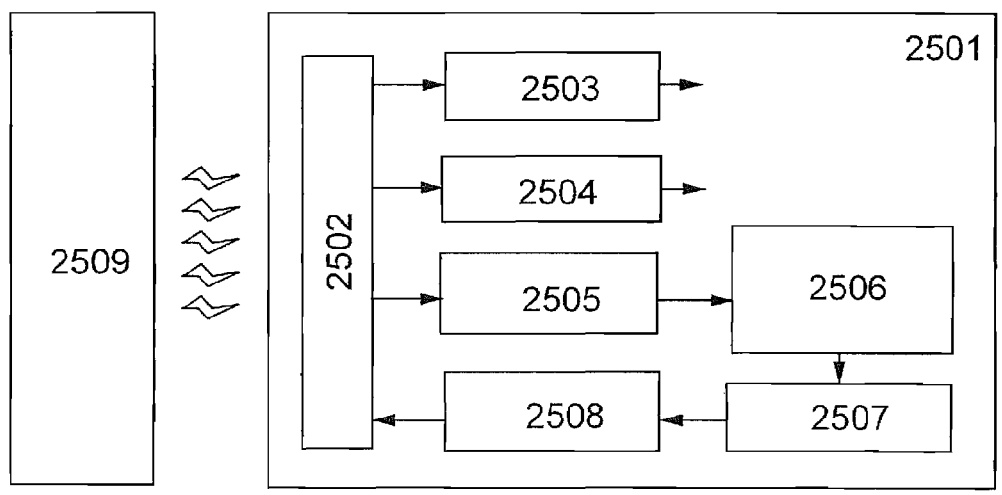
FIG. 20 is a diagram showing a structure of a semiconductor device using the invention.

FIG. 20 shows a structure of a semiconductor device using the invention to transmit and receive a signal by using radio communication. This semiconductor device 2501 has a function to perform radio communication with a reader/writer device 2509. The reader/writer device 2509 is connected by a communication line, and has a function to perform data communication with the semiconductor device 2501 through the control of a computer or as a terminal of the computer. In addition, the reader/writer device 2509 may have a structure for performing communication with the semiconductor device 2501 independent of a network.

The semiconductor device 2501 has a resonance circuit 2502, a power supply circuit 2503, a clock generation circuit 2504, a demodulation circuit 2505, a control circuit 2506, a memory portion 2507, and an encoding and modulation circuit 2508. The resonance circuit 2502 and the power supply circuit 2503 are composed of an analog circuit while the control circuit 2506 and the memory portion 2507 are composed of a digital circuit. The clock generation circuit 2504, the demodulation circuit 2505, and the encoding and modulation circuit 2508 have an analog portion and a digital portion.

Figure 21:
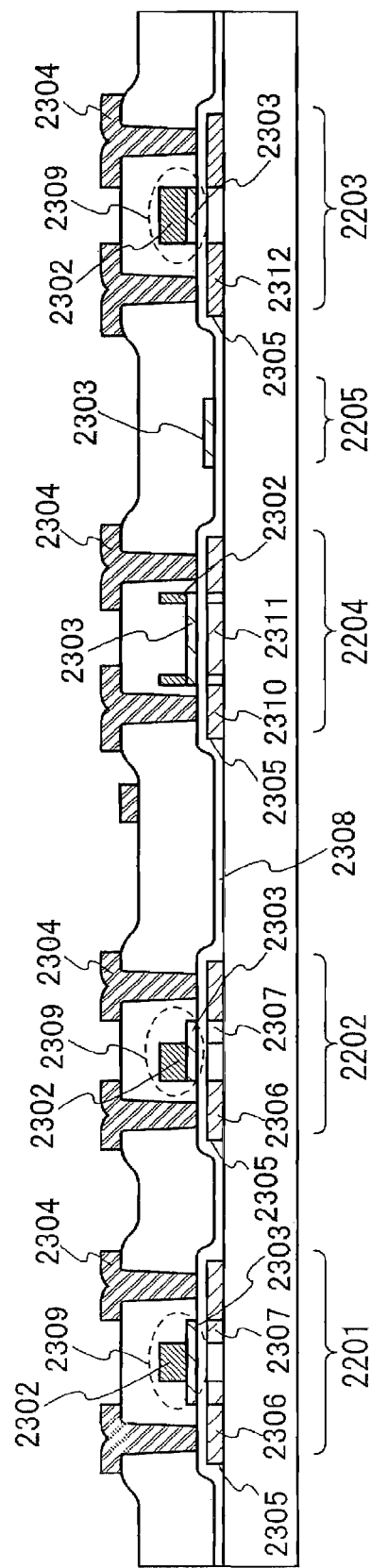
FIG. 21 is a view showing cross section of a circuit using the invention.

These circuits are formed including a transistor. The transistor can be formed of a thin film transistor (TFT) as well as a MOS transistor formed by single crystalline substrate. FIG. 21 is a diagram showing a cross section structure of a transistor forming these circuits. FIG. 21 shows N-channel transistors 2201 and 2202, a capacitor 2204, a resistance element 2205, and a P-channel transistor 2203. Each transistor has a semiconductor layer 2305, a gate insulating layer 2308, and a gate electrode 2309. The gate electrode 2309 is formed with a stacked-layer structure of a first conductive layer 2303 and a second conductive layer 2302. Further, FIGS. 22A to 22D are top views corresponding to the transistor, the capacitor, and the resistance element shown in FIG. 21, and can be referred to in conjunction with FIG. 21.

In FIG. 21, the N-channel transistor 2201 is formed of an impurity region 2306 forming a source region and a drain region each of which is contacted to a wiring 2304, and an impurity region 2307 doped at a lower impurity concentration than that of the impurity region 2306, over the semiconductor layer 2305 in a channel length direction (a direction that a carrier flows). The impurity region 2307 is also called a low concentration drain (LDD). In a case where the N-channel transistor 2201 is formed, phosphorus or the like is doped into the impurity region 2306 and the impurity region 2307 as an impurity imparting n-type. The LDD is formed as a means of suppressing hot electron deterioration and short channel effect.

Figure 22A:
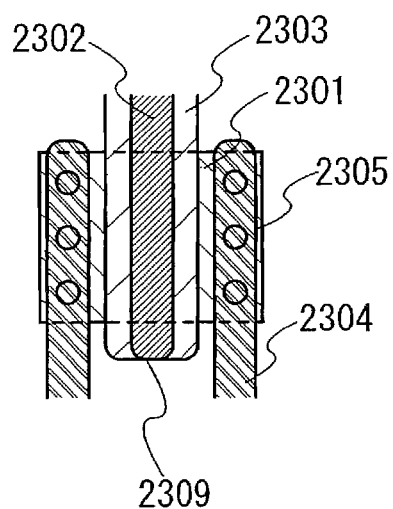
FIGS. 22A to 22E are diagrams each showing a top surface of a circuit using the invention.

The first conductive layer 2303 is formed so as to spread out on either side of the second conductive layer 2302 in the gate electrode 2309 of the N-channel transistor 2201, as shown in FIG. 22A. In this case, a thickness of the first conductive layer 2303 is formed thinner than a thickness of the second conductive layer. The first conductive layer 2303 is formed to a thickness capable of passing ion species accelerated in an electric field of 10 to 100 kV. The impurity region 2307 is formed so as to overlap with the first conductive layer 2303 of the gate electrode 2309. That is, an LDD region overlapping with the gate electrode 2309 is formed. In this structure, one conductive type impurity is doped through the first conductive layer 2303 with the second conductive layer 2302 as a mask, so that the impurity region 2307 is formed in a self-aligning manner in the gate electrode 2309. That is, the LDD overlapping with the gate electrode is formed in a self-aligning manner.

A transistor having an LDD on both sides of a channel forming region is applied to a rectifying TFT of the power supply circuit 2503 or a transistor forming a transmission gate (also called an analog switch) which is used for a logic circuit in FIG. 20. For these TFTs, since both plus and minus voltages are applied to a source/drain electrode, an LDD is preferably provided on both sides of the channel forming region.

Figure 22B:
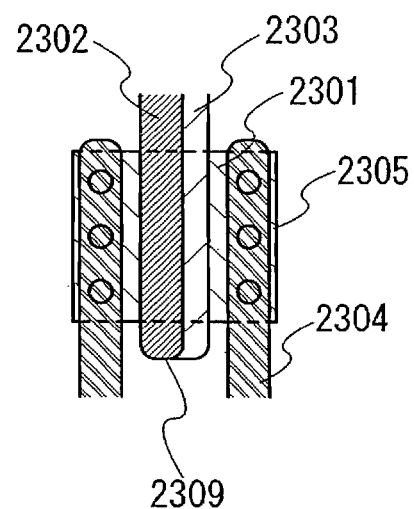

In FIG. 21, the N-channel transistor 2202 is formed of the impurity region 2306 forming the source region and the drain region, and the impurity region 2307 doped at a lower impurity concentration than that of the impurity region 2306, over the semiconductor layer 2305. The impurity region 2307 is provided on one side of a channel forming region so as to be in contact with the impurity region 2306. The first conductive layer 2303 is formed so as to spread out on one side of the second conductive layer 2302 in the gate electrode 2309 of the N-channel transistor 2202, as shown in FIG. 22B. Similarly in this case, one conductive type impurity is doped through the first conductive layer 2303 with the second conductive layer 2302 as a mask, so that the LDD can be formed in a self-aligning manner.

A transistor having an LDD on one side of the channel forming region may be applied to a transistor to which either only a positive voltage or only a negative voltage is applied between a source electrode and a drain electrode. Specifically, such a transistor may be applied to a transistor forming a logic gate such as an inverter circuit, a NAND circuit, a NOR circuit, or a latch circuit, or an analog circuit such as a sense amplifier, a constant voltage generating circuit, or a VCO.

Figure 22C:
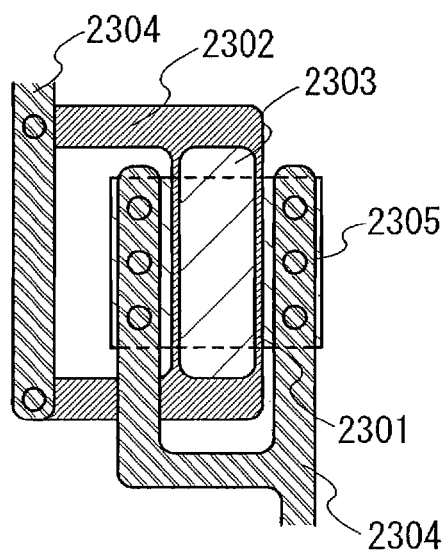
Figure 22D:
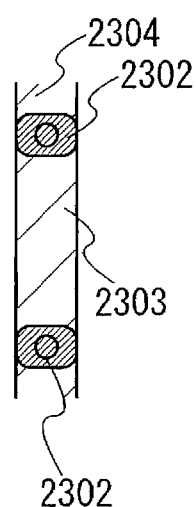
Figure 22E:
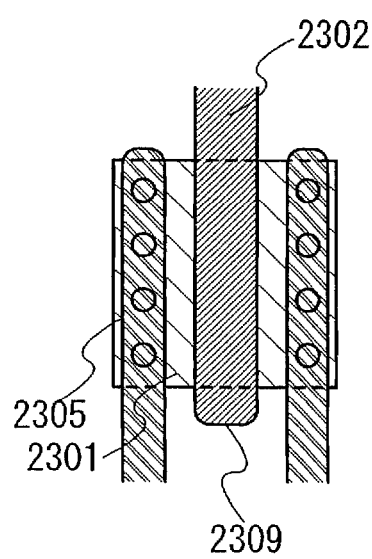

In FIG. 21, the capacitor 2204 is formed with the gate insulating layer 2308 sandwiched between the first conductive layer 2303 and the semiconductor layer 2305. The semiconductor layer 2305 forming the capacitor 2204 has an impurity region 2310 and an impurity region 2311. The impurity region 2311 is formed in the semiconductor layer 2305 at a position overlapping with the first conductive layer 2303. Further, the impurity region 2310 is connected to the wiring 2304. Since the impurity region 2311 can be doped with one conductive type impurity through the first conductive layer 2303, the impurity concentration of the impurity region 2311 can be made the same as that of the impurity region 2310 or can be made different. In any event, since the semiconductor layer 2305 functions as an electrode in the capacitor 2204, it is preferable that one conductive type is doped to be low resistance. Further, the second conductive layer 2302 is used as an auxiliary electrode, as shown in FIG. 22C; therefore, the first conductive layer 2303 can function well as an electrode. In this manner, a composite electrode structure combining the first conductive layer 2303 and the second conductive layer 2302 is used, so that the capacitor 2204 can be formed in a self-aligning manner.

In FIG. 20, a capacitor is used as a storage capacitor that the power supply circuit 2503 has, or as a resonant capacitor that the resonance circuit 2502 has. However, all these capacitors can be replaced with the capacitors of the invention. All these capacitors may be replaced if necessary, or used together.

In FIG. 21, the resistance element 2205 is formed of the first conductive layer 2303. The first conductive layer 2303 is formed to a thickness of about 30 to 150 nm, so the width and the length thereof are set appropriately so that a resistance element can be formed.

A resistance element is used as a resistance load that the modulation circuit 2508 has in FIG. 20. Further, there is a case where the resistance element is used as a load when a current is controlled by a VCO or the like. The resistance element may be formed of a semiconductor layer including an impurity element at high concentration or of a metal layer with a thin film thickness. The resistance value of the semiconductor layer depends on film thickness, film quality, impurity concentration, an activation rate, or the like, while the resistance value of the metal layer is determined by film thickness or film quality, so variation is preferably small.

In FIG. 21, the P-channel transistor 2203 has an impurity region 2312 in the semiconductor layer 2305. The impurity region 2312 focus a source region and a drain region each of which is contacted to the wiring 2304. The structure of the gate electrode 2309 is a structure in which the first conductive layer 2303 overlaps with the second conductive layer 2302. The P-channel transistor 2203 is a transistor having a single drain structure which does not have an LDD. In a case of forming the P-channel transistor 2203, boron or the like is doped as an impurity imparting P-type into the impurity region 2312. On the other hand, when phosphorus is doped into the impurity region 2312, an N-channel transistor having a single drain structure can be formed.

One or both of the semiconductor layer 2305 and the gate insulating layer 2308 may be treated for oxidizing or nitriding by a high density plasma treatment of which the electron temperature is 2 eV or less, the ion energy is 5 eV or less, and the electron density is about $10^{11}$ to $10^{13}/cm^3$, that is excited by microwaves. At this time, by setting the substrate temperature at from 300 to 450° C. and performing the treatment in an oxidative atmosphere ($O_2$, $N_2O$ or the like) or in a nitriding atmosphere ($N_2$, $NH_3$ or the like), defect level in the interface between the semiconductor layer 2305 and the gate insulating layer 2308 can be kept low. By performing this treatment on the gate insulating layer 2308, this insulating layer can be densified. That is, generation of a charged defect is suppressed and the fluctuation of a threshold voltage of a transistor can be suppressed. Further, in a case where a transistor is operated at a voltage of equal to or less than 3 V, the insulating layer oxidized or nitrided by this plasma treatment can be applied as the gate insulating layer 2308. Further, in a case where a driver voltage of a transistor is equal to or more than 3 V, an insulating layer formed over the surface of the semiconductor layer 2305 by this plasma treatment and an insulating layer deposited by CVD (plasma CVD or thermal CVD) can be combined so that the gate insulating layer 2308 can be formed. Similarly, this insulating layer can be used as a dielectric layer of the capacitor 2204. In this case, since an insulating layer formed by this plasma treatment is formed to a thickness of 1 to 10 nm and is a dense film, a capacitor having large charge capacity can be formed.

As described with reference to FIGS. 21 and 22A to 22E, various structural elements can be formed by combining conductive layers having different thickness. A region where only the first conductive layer is formed and a region where the first conductive layer and the second conductive layer are stacked can be formed using a photomask or a reticle in which a diffraction grating pattern or an auxiliary pattern having a light intensity reduction function formed of a semipermeable membrane is provided. That is, when the photoresist is exposed in a photolithography process, the amount of transmission light of a photomask is regulated and resist masks developed have different thicknesses. In this case, a photomask or a reticle is provided with a slit of less than or equal to resolution limitation, and a resist having the aforementioned complicated shape may be formed. Further, a mask pattern baked at about 200° C. after developing and formed by a photoresist material may be changed.

Further, by using a photomask or a reticle in which a diffraction grating pattern or an auxiliary pattern having a light intensity reduction function formed of a semipermeable membrane is provided, a region where only the first conductive layer is formed and a region where the first conductive layer and the second conductive layer are stacked can be fixated in succession. As shown in FIG. 22A, the region where only the first conductive layer is formed can be formed over a semiconductor layer selectively. Such a region is effective over the semiconductor layer; however, it is not required in a region (a wiring region formed in succession with a gate electrode) other than that. By using this photomask or reticle, a region which only has the first conductive layer is not required to be formed in a wiring portion, so wiring density can be increased substantially.

In the case of FIGS. 21 and 22A to 22E, the first conductive layer is formed of a metal material having a high melting point such as tungsten (W), chromium (Cr), tantalum (Ta), tantalum nitride (TaN) or molybdenum (Mo), or an alloy or a compound containing the metal material having a high melting point as its main component with a thickness of 30 to 50 nm. In addition, the second conductive layer is formed of a metal material having a high melting point such as tungsten (W), chromium (Cr), tantalum (Ta), tantalum nitride (TaN) or molybdenum (Mo), or an alloy or a compound containing the metal material having a high melting point as its main component, with a thickness of 300 to 600 nm. For example, different conductive materials are used for the first conductive layer and the second conductive layer in order to generate the difference in an etching rate in an etching process later. As an example, TaN can be used for the first conductive layer and a tungsten film can be used for the second conductive layer.

This embodiment shows that by using a photomask or a reticle in which a di action grating pattern or an auxiliary pattern having a light intensity reduction function formed of a semipermeable membrane is provided, a transistor, a capacitor, and a resistance element of a different electrode structure can be separately formed by the same patterning process. Therefore, in correspondence with a property of a circuit, elements of different forms can be formed without increasing the process and can be integrated.

Note that this embodiment can be freely combined with Embodiment Modes 1 to 5.

[Embodiment 2]

As one element which forms the semiconductor device shown in FIG. 20, an example of forming a static RAM (SRAM) is described with reference to FIGS. 23A to 25B.

Figure 23A:
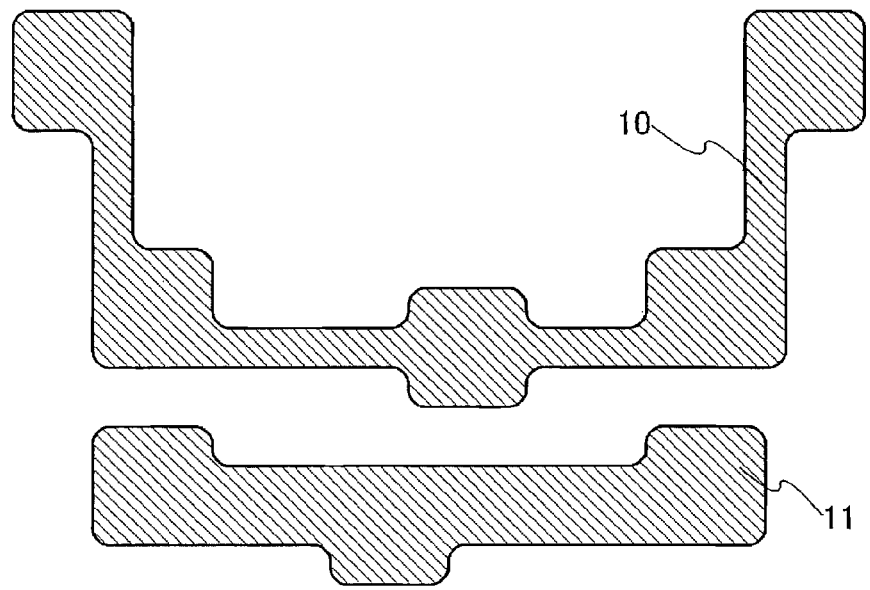
FIGS. 23A and 23B are diagrams each showing a top surface and a mask pattern of a circuit using the invention.

Semiconductor layers 10 and 11 shown in FIG. 23A are preferably formed of silicon or a crystalline semiconductor with silicon as a component. For example, polycrystalline silicon in which a silicon film is crystallized by laser annealing or the like, single crystal silicon, or the like is applied. In addition, metal-oxide semiconductor which shows a semiconductor property, amorphous silicon which shows a semiconductor property, or organic semiconductor which shows a semiconductor property can be applied.

In any event, a semiconductor layer to be formed first is formed on the entire surface or one part of a substrate (a region having a larger area than a region decided on as a semiconductor region of a transistor) having an insulating surface. Then, by using a photolithography technique, a mask pattern is formed over the semiconductor layer. An etching process is performed over the semiconductor layer using the mask pattern, so that and the specially-shaped island-shaped semiconductor layers 10 and 11 which include a source region and a drain region of a TFT and a channel forming region are formed. The semiconductor layers 10 and 11 are decided taking suitability of layout into consideration.

Figure 23B:
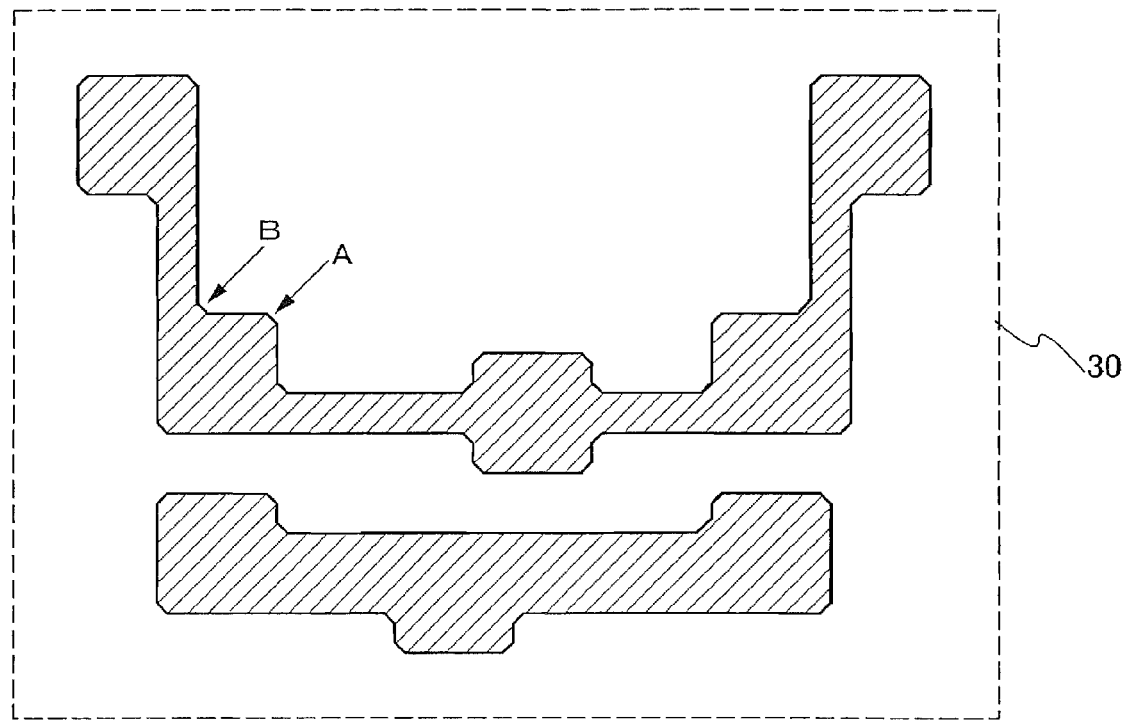

A photomask for forming the semiconductor layers 10 and 11 shown in FIG. 23A has a mask pattern 30 as shown in FIG. 23B. This mask pattern 30 is different depending on whether the resist which is used in the photolithography process is positive or negative. In a case of using a positive resist, the mask pattern 30 shown in FIG. 23B is formed as a light shielding portion. The mask pattern 30 has a shape in which a convex portion A of a polygon is removed. Further, a concave portion B has a shape which has a plurality of corners so that the concave portion does not become a right angle. Further, this photomask has a pattern which a corner is removed so that one side of the triangle is 10 µm or shorter; for example.

The shape of the mask pattern 30 shown in FIG. 23B is reflected on the semiconductor layers 10 and 11 shown in FIG. 23A. In that case, a similar shape to the mask pattern 30 may be transferred; however, it may also be transferred so that corners of the mask pattern 30 are more rounded. That is, a round portion in which a pattern shape is made smoother than that in the mask pattern 30 may be provided.

Figure 24A:
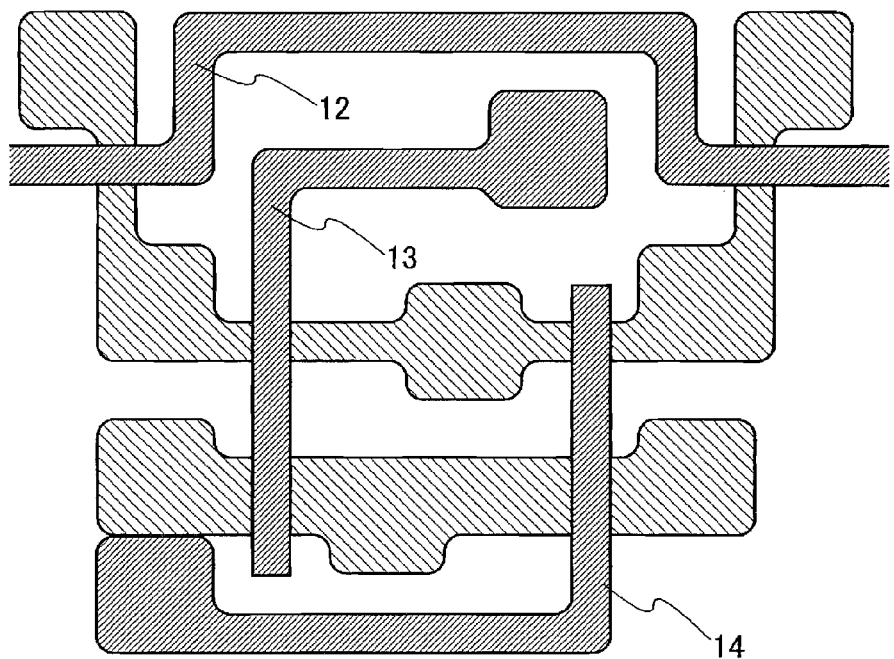
FIGS. 24A and 24B are diagrams each showing a top surface and a mask pattern of a circuit using the invention.

Over the semiconductor layers 10 and 11, an insulating layer including silicon oxide or silicon nitride in at least one part thereof is formed. One of the aims of forming this insulating layer is to have a gate insulating layer. Then, as shown in FIG. 24A, gate wirings 12, 13, and 14 are formed so as to overlap with a part of the semiconductor layer. The gate wiring 12 is formed to correspond with the semiconductor layer 10. The gate wiring 13 is formed to correspond with the semiconductor layers 10 and 11. Further, the gate wiring 14 is formed to correspond with the semiconductor layers 10 and 11. For a gate wiring, a metal layer or a semiconductor layer having high conductivity is deposited and the shape is formed over an insulating layer by photolithography technique.

Figure 24B:
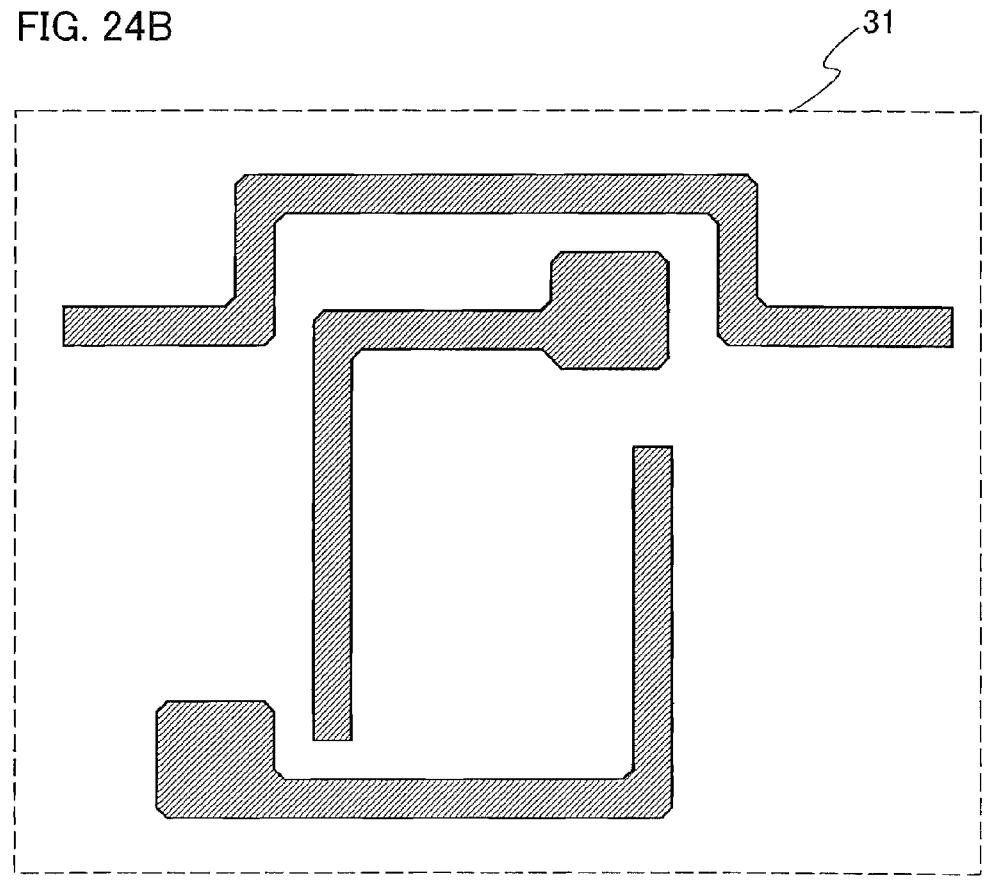

A photomask for forming this gate wiring has a mask pattern 31, as shown in FIG. 24B. This mask pattern 31 has a shape which a corner is removed so that one side of the triangle is 10 µm or shorter, or equal to or longer than one-fifth the width of the wiring layer and equal to or shorter than half the width of the wiring layer. The shape of the mask pattern 31 shown in FIG. 24B is reflected on the gate wirings 12, 13, and 14 shown in FIG. 24A. In that case, a similar shape to the mask pattern 31 may be transferred; however, it may also be transferred so that corners of the mask pattern 31 are more rounded. That is, a round portion in which a pattern shape is made smoother than that in the mask pattern 31 may be provided over the gate wirings 12, 13, and 14. That is, edges of the corners of the gate wirings 12, 13, and 14 are rounded by removing sharp corners with equal to or longer than one-fifth the width of the wiring layer and equal to or shorter than half the width of the wiring layer. As for a convex portion, generation of powder by abnormal electrical discharge is suppressed when dry etching by plasma is conducted. As for a concave portion, any powder which has been generated, which tends to gather at the corners is washed away at the time of cleaning. As a result, there is an effect that yield can be significantly improved.

An interlayer insulation layer is formed after forming the gate wirings 12, 13, and 14. The interlayer insulating layer is formed using an inorganic insulating material such as silicon oxide or an organic insulating material such as polyimide or an acrylic resin. An insulating layer using such as silicon nitride or silicon nitride oxide may be formed between the interlayer insulating layer and the gate wirings 12, 13, and 14. In addition, an insulating layer such as silicon nitride or silicon nitride oxide may also be formed over the interlayer insulating layer. The insulating layer can prevent contamination of the semiconductor layer and a gate insulating layer by an impurity such as an exogenous metal ion and moisture, which are not good for a TFT.

Figure 25A:
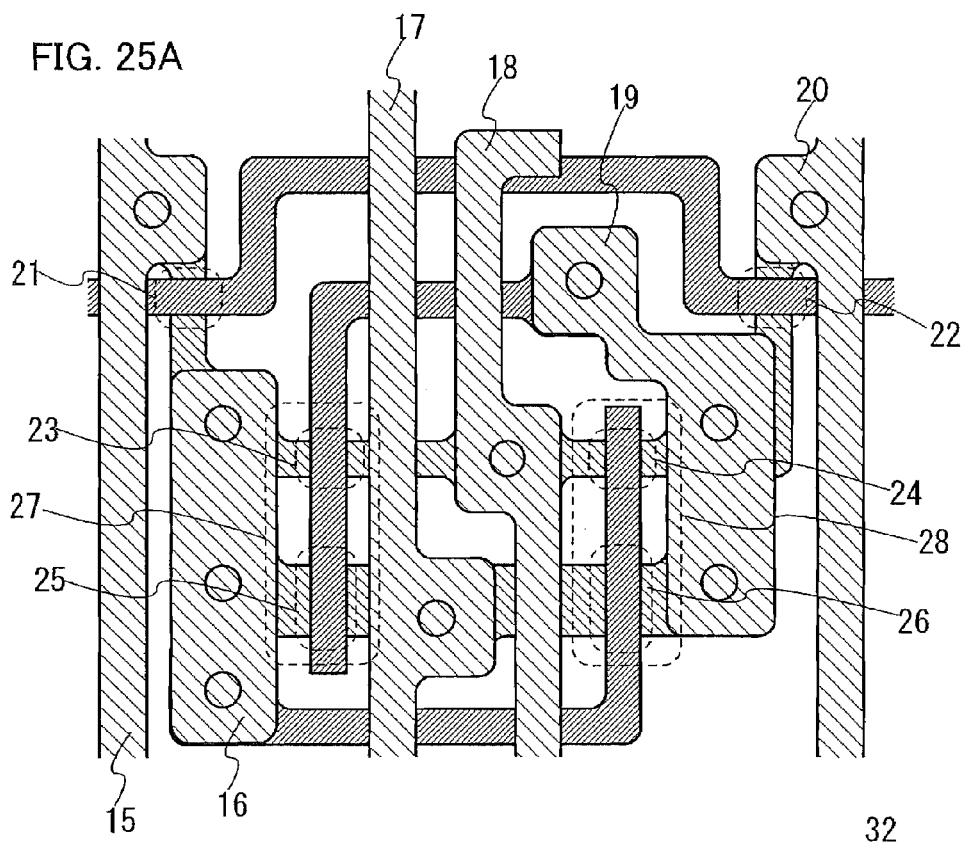
FIGS. 25A and 25B are diagrams each showing a top surface and a mask pattern of a circuit using the invention.

In the interlayer insulating layer, an opening portion is formed at a predetermined position. For example, the opening portion is provided so as to correspond with the gate wires and the semiconductor layer in the layer below. For a wiring layer formed of a single layer or stacked layers of metal or a metal compound, a mask pattern is formed by photolithography technique and is patterned in a predetermined pattern by etching. Then, as shown in FIG. 25A, wirings 15 to 20 are formed so as to partially overlap the semiconductor layer. The wiring connects specific elements. The wiring does not connect specific elements with a straight line. The wiring includes portions that bend, due to restrictions of the layout. In addition, the width of the wiring changes in a contact portion or in another region. In the contact portion, the width of the wiring is widened in the portion in the case where the contact hole is the same width or wider than the width of the wiring.

Figure 25B:
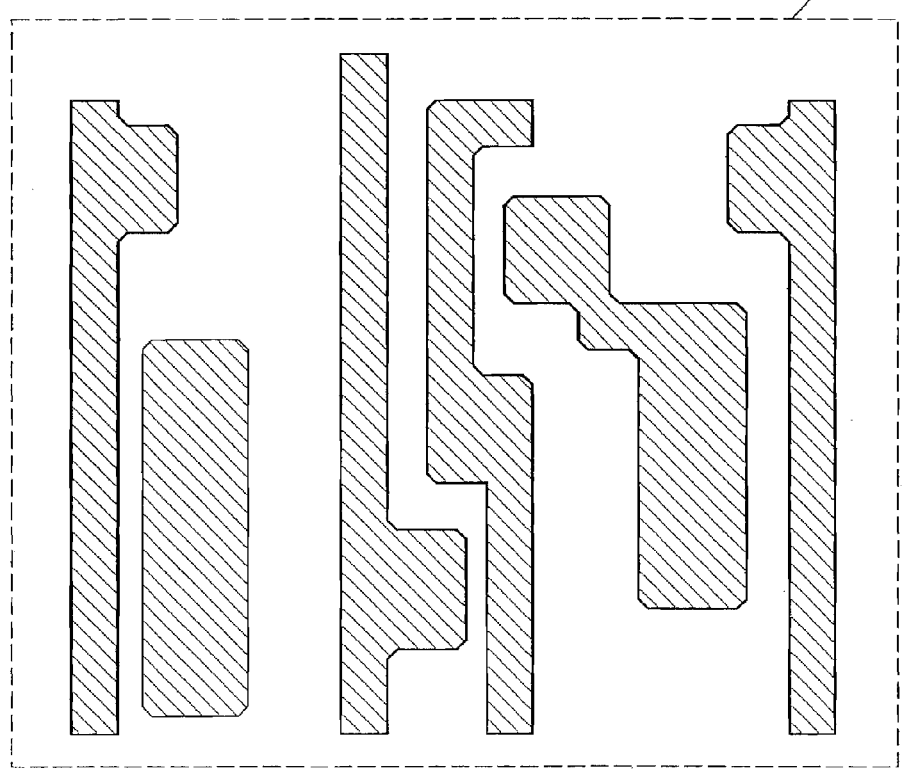

A photomask for forming the wirings 15 to 20 has a mask pattern 32 as shown in FIG. 25B. As shown in the top view of FIG. 25B, the wiring layer has a pattern where a corner that is a right triangle in each edge bent into an L shape is removed so that one side of the triangle is 10 □m or shorter, or equal to or longer than one-fifth the width of the wiring layer and equal to or shorter than half the width of the wiring layer, thereby the edge is rounded. That is to say, the circumference of the wiring layer in the edge is curved when seen from above. Specifically, in order to form a round circumference of the edge, a part of the wiring layer is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring layer. At this time, the wiring layer is preferably etched by appropriately adjusting the etching conditions so that a curved line in contact with the first straight line and the second straight line is formed in each obtuse angle part. Note that the length of the two sides of the isosceles right triangle, which are equal to each other, is equal to or longer than one-fifth the width of the wiring layer and equal to or shorter than half the width of the wiring layer. In addition, the inner circumference of the edge is also made curved in accordance with the circumference of edge. In such a wiring, as for a convex portion, generation of powder by abnormal electrical discharge is suppressed when dry etching by plasma is conducted. As for a concave portion, any powder which has been generated, which tends to gather at the corners is washed away at the time of cleaning. As a result, there is an effect that yield can be significantly improved. By making the corners of the wiring round, the wiring can be expected to be electrically conductive. In addition, it is extremely convenient when washing away dust in multiple parallel wirings.

In FIG. 25A, N-channel transistors 21 to 24, and P-channel transistors 25 and 26 are formed. The N-channel transistor 23 and the P-channel transistor 25 form an inverter and the N-channel transistor 24 and the P-channel transistor 26 form an inverter. A circuit including the foregoing 6 transistors forms an SRAM. An insulating layer such as silicon nitride or silicon oxide may be formed over these transistors.

Note that this embodiment can be freely combined with from Embodiment Modes 1 to 5 and Embodiment 1.

[Embodiment 3]

In this embodiment, an application of a semiconductor device foaled by using this embodiment mode is described with reference to drawings.

By the invention, a semiconductor device that functions as a processor chip (also called a wireless chip, a wireless processor, a wireless memory, and a wireless tag) can be formed. The semiconductor device of the invention has a wide range of use; however as examples, it can be used by mounting it on bills, coins, securities, certificates, bearer bonds, packaging cases and containers, books, recording media, personal belongings, vehicles, foods, clothes, health items, lifestyle goods, medicals, electronic devices or the like.

Figure 26A:
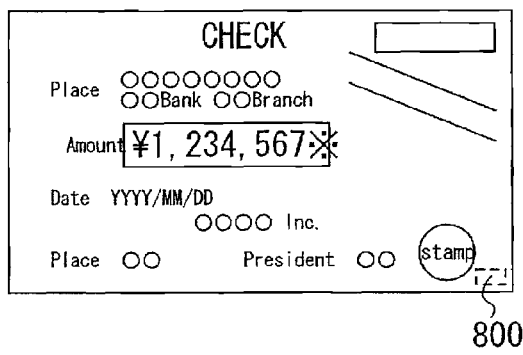
FIGS. 26A to 26G are views each showing application of the invention.
Figure 26B:
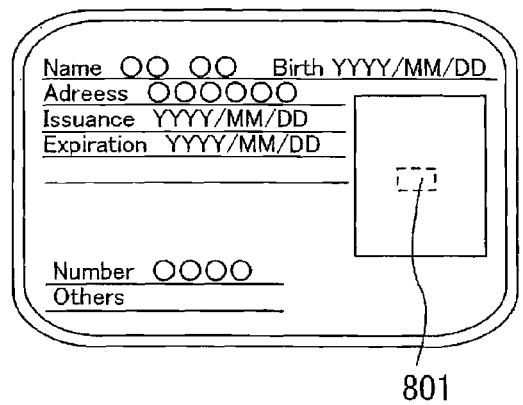
Figure 26C:
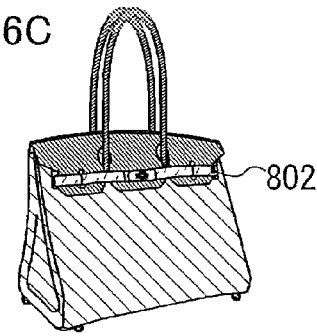
Figure 26D:
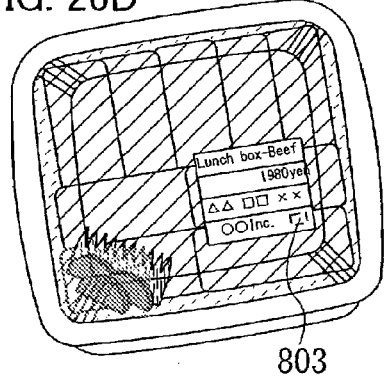
Figure 26E:
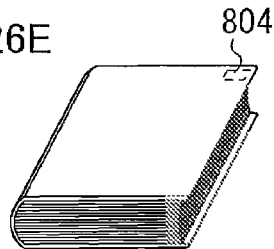
Figure 26F:
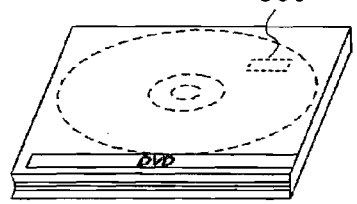
Figure 26G:
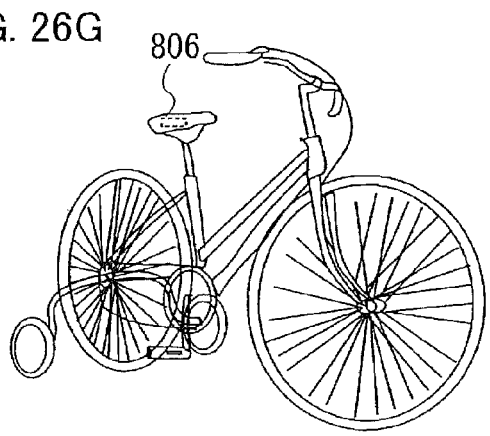

The bills and the coins mean currency in the market and include something that is used in the same way as a currency in a specific area (e.g., a cash voucher), memorial coins, and the like. The securities mean a check, a stock certificate, a promissory bill, and the like, and can be provided with a processor chip 800 (refer to FIG. 26A). The certificates mean a driver's license, a resident card, and the like and can be provided with a processor chip 801 (refer to FIG. 26B). The personal belongings mean a bag, glasses, and the like and can be provided with a processor chip 802 (refer to FIG. 26C). The bearer bonds mean a stamp, a coupon for rice, various gift coupons, and the like. The packing cases and containers mean wrapping paper for a lunch box or the like, a plastic bottle, and the like and can be provided with a processor chip 803 (refer to FIG. 26D). The books mean a book, a volume, a magazine, and the like, and can be provided with a processor chip 804 (refer to FIG. 26E). The recording medium means DVD software, a video tape, and the like, and can be provided with a processor chip 805 (refer to FIG. 26F). The vehicles mean a wheeled vehicle such as a bicycle, a vessel, and the like, and can be provided with a processor chip 806 (refer to FIG. 26G). The foods mean foodstuff, beverages, and the like. The clothes mean garments, footwear, and the like. The health items mean medical instruments, health appliances, and the like. The lifestyle goods mean furniture, a lighting apparatus, and the like. The medicals mean medicines, agricultural chemicals, and the like. The electronic devices mean a liquid crystal display device, an EL display device, a television apparatus (a TV set and a thin television set), a cellular phone, and the like.

Further, the processor chip of the invention having a characteristic of being smaller or of having more sophisticated functions, or having both characteristics, is fixed on an item by being mounted on a printed-circuit board, by being affixed to a surface, by being embedded, or the like. For example, it is fixed on a book by being embedded in paper, or it is fixed on a packaging case made of an organic resin by being embedded in the organic resin. Since the processor chip of the invention is compact in size, thin, and lightweight, it does not detract from the design of an item itself after it is fixed on the item. Also, by providing the processor chip of the invention on bills, coins, securities, bearer bonds, certificates and the like, an authentication function can be provided, and by utilizing this identification/authentication function, counterfeiting can be prevented. Furthermore, by providing the semiconductor device of the present invention on packaging cases and containers, recording media, personal belongings, foods, clothes, lifestyle goods, electronic devices and the like, improvement in efficiency for inspection systems and the like can be achieved.

Figure 27:
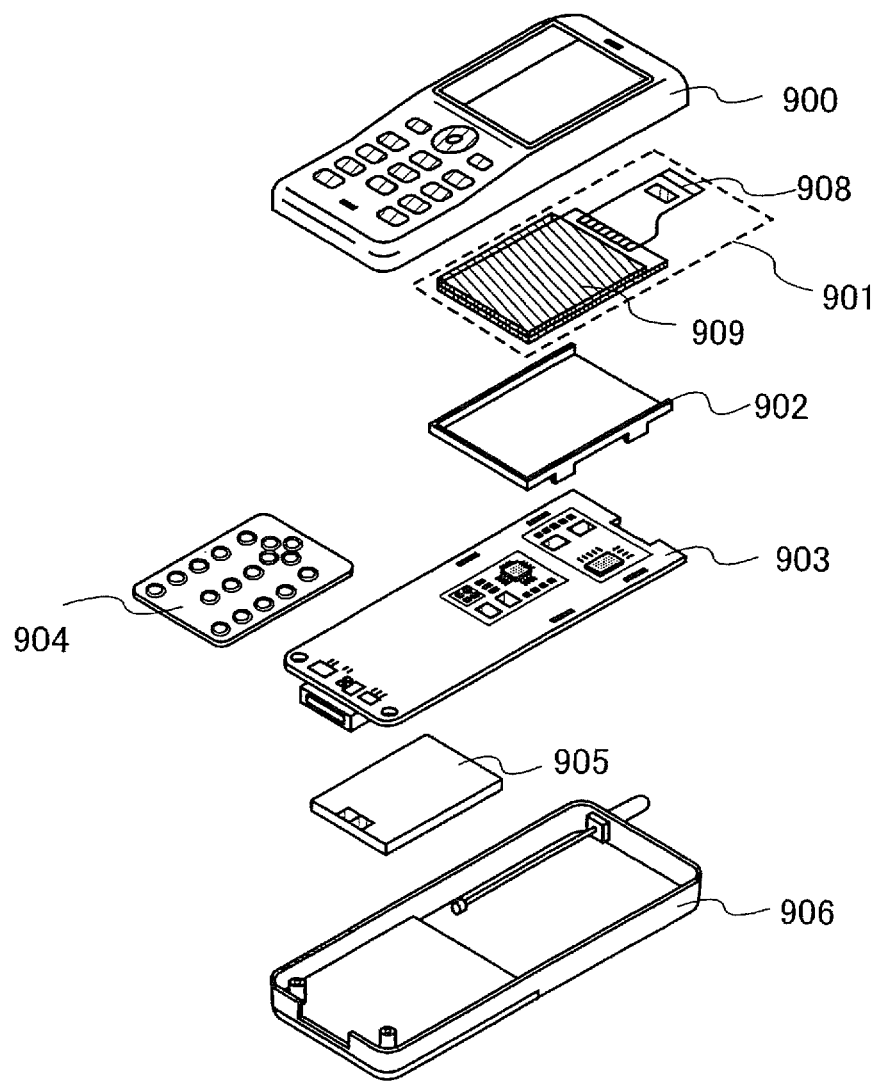
FIG. 27 is a view showing application of the invention.

One mode of an electronic device which the semiconductor device of the invention is mounted on is explained with reference to drawings. An example of an electronic device in FIG. 27 shows a cellular phone which has chassis 900 and 906; a panel 901; a housing 902; a printed wiring board 903; an operation button 904; and a battery 905. The panel 901 is detachably incorporated in the housing 902, and the housing 902 is fitted to the printed wiring board 903. The form and size of the housing 902 is changed as is appropriate depending on an electronic device which the panel 901 is to be incorporated into. On the printed wiring board 903, a plurality of packaged semiconductor devices are mounted, and as one of these, the capacitor of the invention can be used. The plurality of semiconductor devices that are mounted on the printed wiring board 903 have any of the functions of a controller, a Central Processing Unit (CPU), a memory, a power supply circuit, an audio processing circuit, a transmission/reception circuit or the like.

The panel 901 is connected to the printed wiring board 903 via a connection film 908. The panel 901, the housing 902, and the printed wiring board 903 are enclosed inside of the chassis 900 and 906, along with the operation button 904 and the battery 905. A pixel region 909 that is included in the panel 901 is located so that it is visible from an open window that is provided for the chassis 900.

The semiconductor device to which the capacitor of the present invention is applied is compact in size, thin, and lightweight, and because of these characteristics, the limited space inside of the chassis 900 and 906 of an electronic device can be used effectively.

Note that for the chassis 900 and 906, an exterior form of a cellular phone is shown as an example, and an electronic device to correspond with this embodiment mode may transform into various modes in response to the function or use.

This application is based on Japanese Patent Application serial no. 2005-160343 filed in Japan Patent Office on May 31, 2005, the entire contents of which are hereby incorporated by reference.

What is claimed is:

1. A semiconductor device comprising:
   a first transistor;
   a second transistor;
   a first inverter comprising a third transistor and a fourth transistor; and
   a second inverter comprising a fifth transistor and a sixth transistor,
   wherein one of a source and a drain of the first transistor is electrically connected to one of a source and a drain of the third transistor, one of a source and a drain of the fourth transistor, a gate of the fifth transistor, and a gate of the sixth transistor,
   wherein one of a source and a drain of the second transistor is electrically connected to one of a source and a drain of the fifth transistor, one of a source and a drain of the sixth transistor, a gate of the third transistor, and a gate of the fourth transistor, and
   wherein each of the first transistor, the second transistor, the third transistor, the fourth transistor, the fifth transistor, and the sixth transistor comprises:
      a semiconductor layer over an insulating surface, the semiconductor layer comprising a metal oxide semiconductor;
      a gate insulating layer over the semiconductor layer; and a gate wiring over the semiconductor layer with the gate insulating layer therebetween.

2. The semiconductor device according to claim 1, wherein at least one part of the gate insulating layer includes silicon oxide or silicon nitride.

3. The semiconductor device according to claim 1,
wherein each of the first transistor, the second transistor, the third transistor, and the fifth transistor is an N-channel transistor, and
wherein each of the fourth transistor and the sixth transistor is a P-channel transistor.

4. A semiconductor device comprising:
a first transistor;
a second transistor;
a first inverter comprising a third transistor and a fourth transistor; and
a second inverter comprising a fifth transistor and a sixth transistor,
wherein one of a source and a drain of the first transistor is electrically connected to one of a source and a drain of the third transistor, one of a source and a drain of the fourth transistor, a gate of the fifth transistor, and a gate of the sixth transistor,
wherein one of a source and a drain of the second transistor is electrically connected to one of a source and a drain of the fifth transistor, one of a source and a drain of the sixth transistor, a gate of the third transistor, and a gate of the fourth transistor, and
wherein each of the first transistor, the second transistor, the third transistor, the fourth transistor, the fifth transistor, and the sixth transistor comprises:
a semiconductor layer over an insulating surface, the semiconductor layer comprising a metal oxide semiconductor;
a gate insulating layer over the semiconductor layer;
a gate wiring over the semiconductor layer with the gate insulating layer therebetween;
an interlayer insulating layer over the gate wiring; and
a wiring over the interlayer insulating layer, the wiring electrically connected to the semiconductor layer.

5. The semiconductor device according to claim 4, wherein at least one part of the gate insulating layer includes silicon oxide or silicon nitride.

6. The semiconductor device according to claim 4, wherein the interlayer insulating layer is formed using silicon oxide, polyimide or acrylic resin.

7. The semiconductor device according to claim 4, further comprising a first insulating layer between the gate wiring and the interlayer insulating layer.

8. The semiconductor device according to claim 4, further comprising a second interlayer insulating layer between the interlayer insulating layer and the wiring.

9. The semiconductor device according to claim 4, wherein the wiring includes stacked layers.

10. The semiconductor device according to claim 4,
wherein the interlayer insulating layer has a contact hole, and
wherein the wiring is in contact with the semiconductor layer through a contact hole.

11. The semiconductor device according to claim 4,
wherein each of the first transistor, the second transistor, the third transistor, and the fifth transistor is an N-channel transistor, and
wherein each of the fourth transistor and the sixth transistor is a P-channel transistor.

* * * * *